(12) United States Patent
Noda et al.

(10) Patent No.: US 11,837,850 B2
(45) Date of Patent: Dec. 5, 2023

(54) SURFACE-EMITTING LASER DEVICE AND METHOD FOR MANUFACTURING SURFACE-EMITTING LASER DEVICE

(71) Applicants: Kyoto University, Kyoto (JP); Stanley Electric Co., Ltd., Tokyo (JP)

(72) Inventors: Susumu Noda, Kyoto (JP); Tomoaki Koizumi, Tokyo (JP); Kei Emoto, Tokyo (JP)

(73) Assignees: KYOTO UNIVERSITY, Kyoto (JP); STANLEY ELECTRIC CO., LTD., Tokyo (JP)

( * ) Notice: Subject to any disclaimer, the term of this patent is extended or adjusted under 35 U.S.C. 154(b) by 315 days.

(21) Appl. No.: 17/123,126

(22) Filed: Dec. 16, 2020

(65) Prior Publication Data

US 2021/0184430 A1 Jun. 17, 2021

(30) Foreign Application Priority Data

Dec. 16, 2019 (JP) .................. 2019-226781

(51) Int. Cl.
*H01S 5/11* (2021.01)
*H01S 5/18* (2021.01)
(Continued)

(52) U.S. Cl.
CPC .............. *H01S 5/18* (2013.01); *H01S 5/0206* (2013.01); *H01S 5/11* (2021.01); *H01S 5/2081* (2013.01);
(Continued)

(58) Field of Classification Search
CPC .......... H01S 5/11; H01S 5/206; H01S 5/2081; H01S 5/34333; H01S 2304/04; H01S 5/185
See application file for complete search history.

(56) References Cited

U.S. PATENT DOCUMENTS 8,971,370 B1 * 3/2015 Raring ................. H01S 5/2214 372/44.011
11,539,187 B2 * 12/2022 Noda ....................... H01S 5/11
(Continued)

FOREIGN PATENT DOCUMENTS

JP 2007-067182 A 3/2007
JP 2009-206157 A 9/2009
(Continued)

OTHER PUBLICATIONS

Extended European search report dated May 26, 2021, in corresponding European patent Application No. 20214140.4, 12 pages.
(Continued)

*Primary Examiner* — Michael Carter
(74) *Attorney, Agent, or Firm* — XSENSUS LLP

(57) ABSTRACT

A method for manufacturing a GaN-based surface-emitting laser by an MOVPE includes: (a) growing a first cladding layer with a {0001} growth plane; (b) growing a guide layer on the first cladding layer; (c) forming holes in a surface of the guide layer by etching, the holes being two-dimensionally periodically arranged within a plane parallel to the guide layer; (d) etching the guide layer by using an etchant having selectivity to the {0001} plane and a {10–10} plane of the guide layer; (e) supplying a gas containing a nitrogen source to cause mass transport without supplying a group-III material gas, and then supplying the group-III material gas for growth, whereby a first embedding layer closing openings of the holes is formed to form a photonic crystal layer; and (f) growing an active layer and a second cladding layer in this order on the first embedding layer.

7 Claims, 26 Drawing Sheets

(51) Int. Cl.
  H01S 5/02  (2006.01)
  H01S 5/20  (2006.01)
  H01S 5/343 (2006.01)
(52) U.S. Cl.
  CPC ...... *H01S 5/34333* (2013.01); *H01S 2304/04* (2013.01)

(56) References Cited

U.S. PATENT DOCUMENTS

| | | | |
|---|---|---|---|
| 2011/0039364 A1* | 2/2011 | Kawashima | H01L 21/02513 438/46 |
| 2014/0219306 A1* | 8/2014 | Wright | H01S 5/187 372/45.012 |
| 2021/0226420 A1* | 7/2021 | Aoki | H01S 5/18305 |

FOREIGN PATENT DOCUMENTS

| | | |
|---|---|---|
| JP | 2009-302250 A | 12/2009 |
| JP | 2011-119349 A | 6/2011 |
| JP | 4818464 B2 | 11/2011 |
| JP | 5082447 B2 | 11/2012 |
| JP | 2019-114663 A | 7/2019 |
| WO | 2011/013363 A1 | 2/2011 |
| WO | 2019/124312 A1 | 6/2019 |
| WO | 2019/235535 A1 | 12/2019 |

OTHER PUBLICATIONS

Jeremy B. Wright et al., "Multi-Color Arrays of III-Nitride Photonic Crystal Nanowire Lasers on a Single Chip", CLEO:2013 Technical Digest @ OSA 2013, The Optical Sociery, 2013, total 2 pages.

Matsubara et al., "GaN Photonic-Crystal Surface-Emitting Laser at Blue-Violet Wavelengths", Science, vol. 319, Jan. 25, 2008, pp. 445-447, total 4 pages.

Miyake et al., "Effects of Reactor Pressure on Epitaxial Lateral Overgrowth of GaN via Low-Pressure Metalorganic Vapor Phase Epitaxy", Jpn. J. Appl. Phys., vol. 38, Sep. 15, 1999, Pt. 2, No. 9A/B, pp. L 1000-L 1002, total 4 pages.

Tanaka et al., "Discussion of In-plane Diffraction and Threshold Gain Difference in PCSEL", Japanese Society of Applied Physics Autumn Meeting 2016 preprints, 15p-B4-20, total 2 page with English Abstract attached.

Liang et al., "Three-dimensional coupled-wave model for square-lattice photonic crystal lasers with transverse electric polarization: A general approach", Physical Review B, vol. 84, 2011, pp. 195119-1-195119-11, total 11 pages.

Japanese Office Action dated Jul. 25, 2023 in corresponding Japanese Patent Application No. 2019-226781 (with machine-generated English translation), 12 pages.

Japanese Office Action dated Oct. 3, 2023 in corresponding Japanese Patent Application No. 2019-226781 (with machine-generated English translation), 8 pages.

* cited by examiner

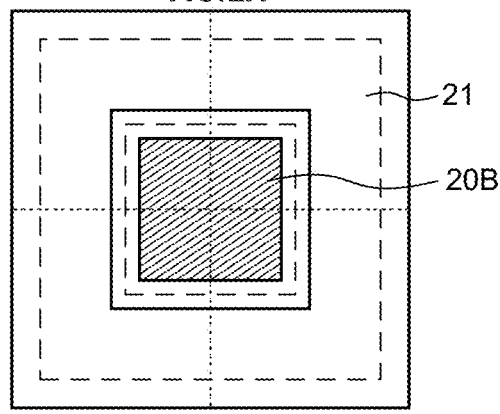
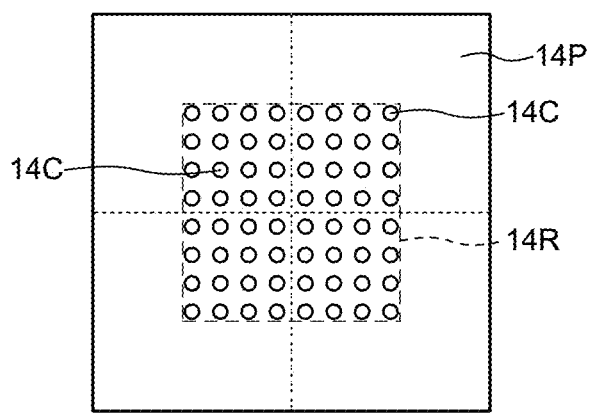
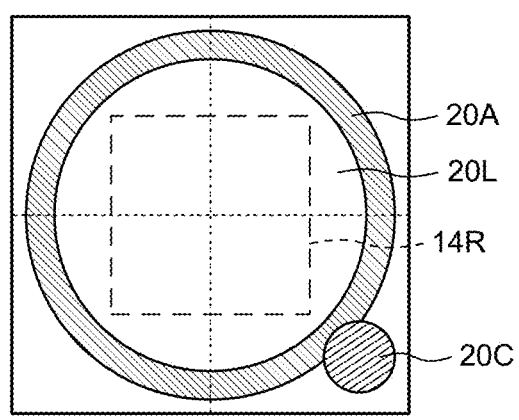

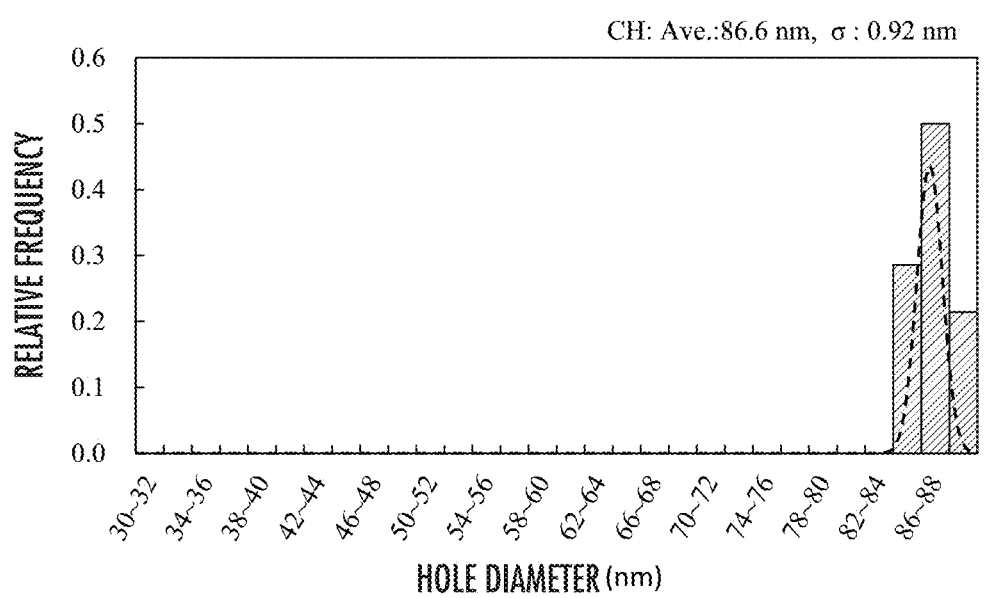

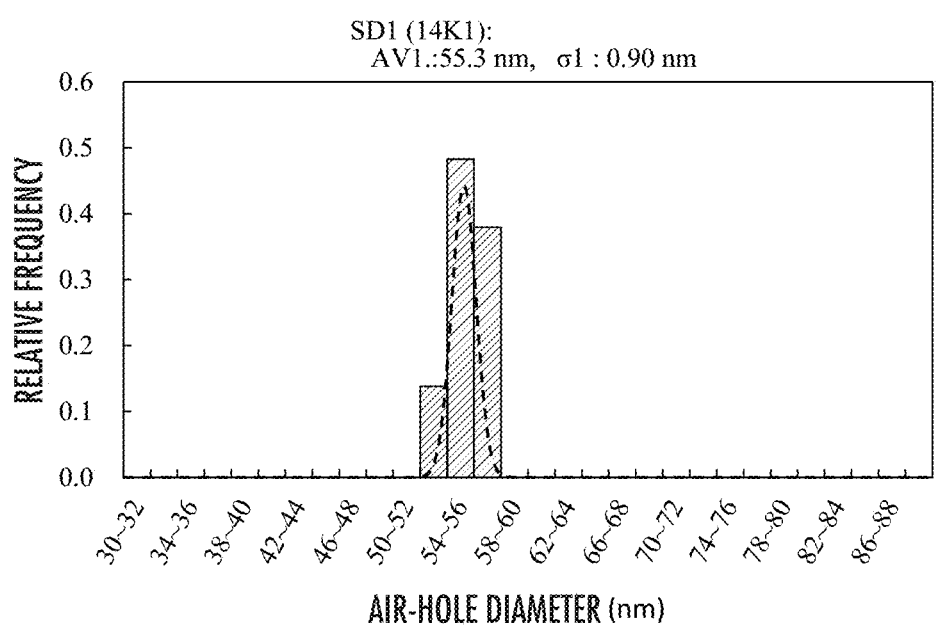

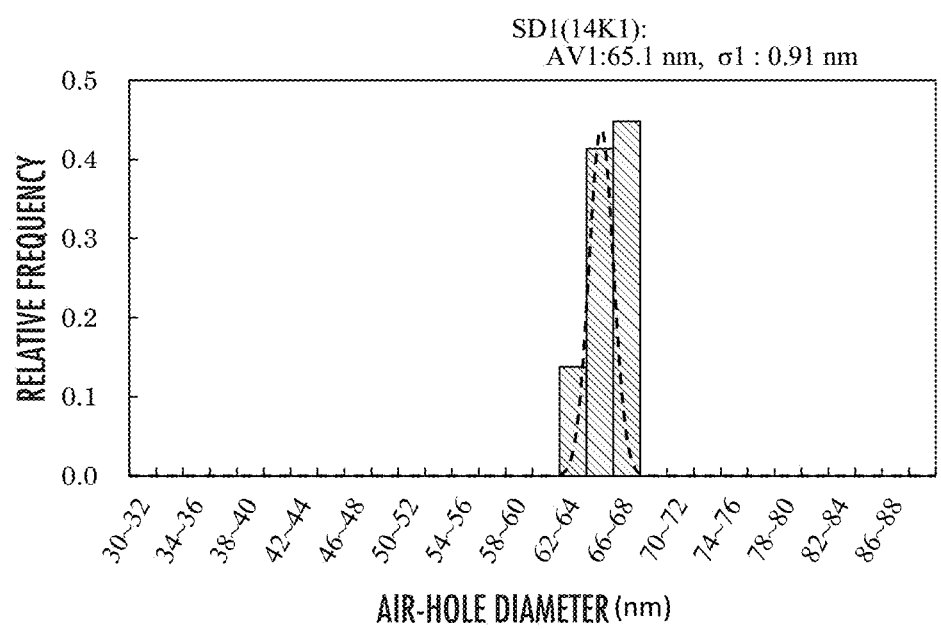

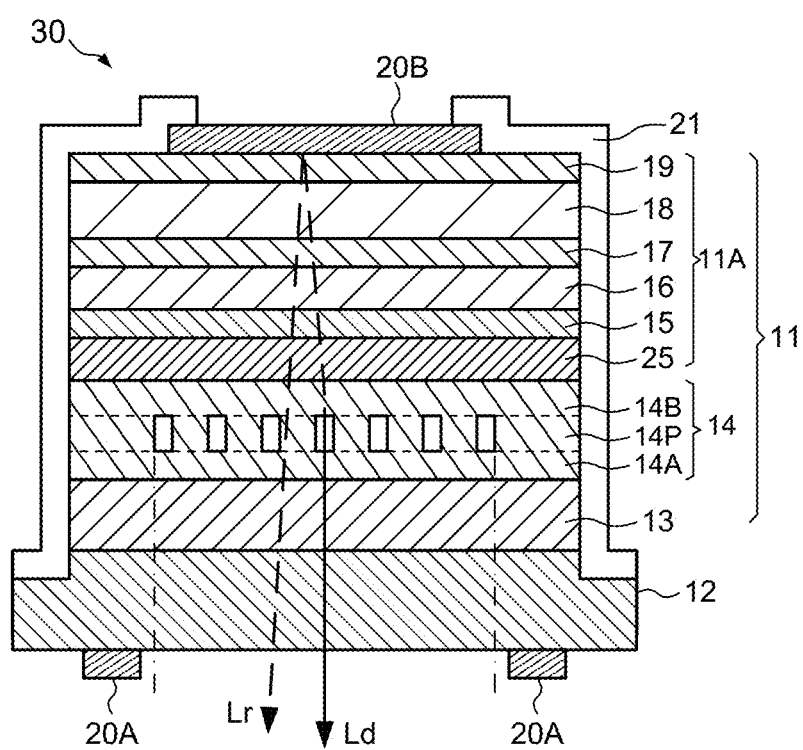

[ SECTION ALONG A-A ]

[ SECTION ALONG B-B ]

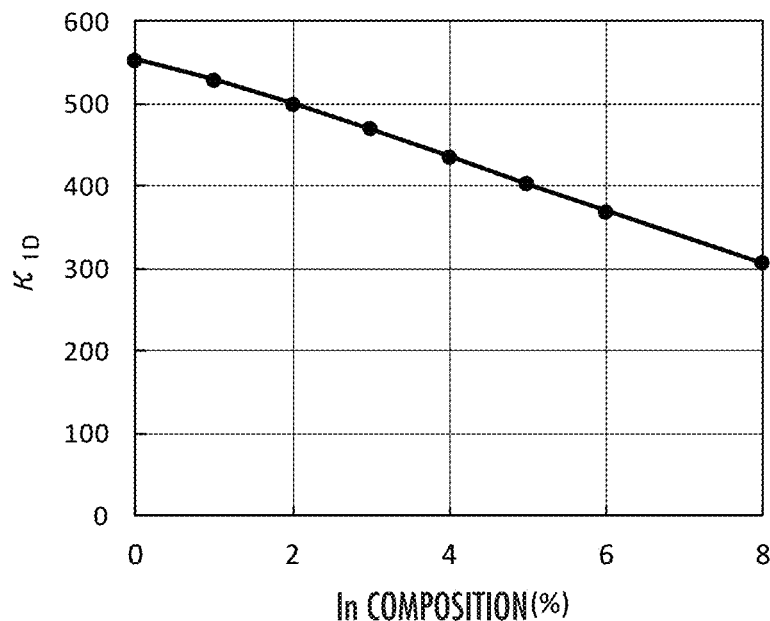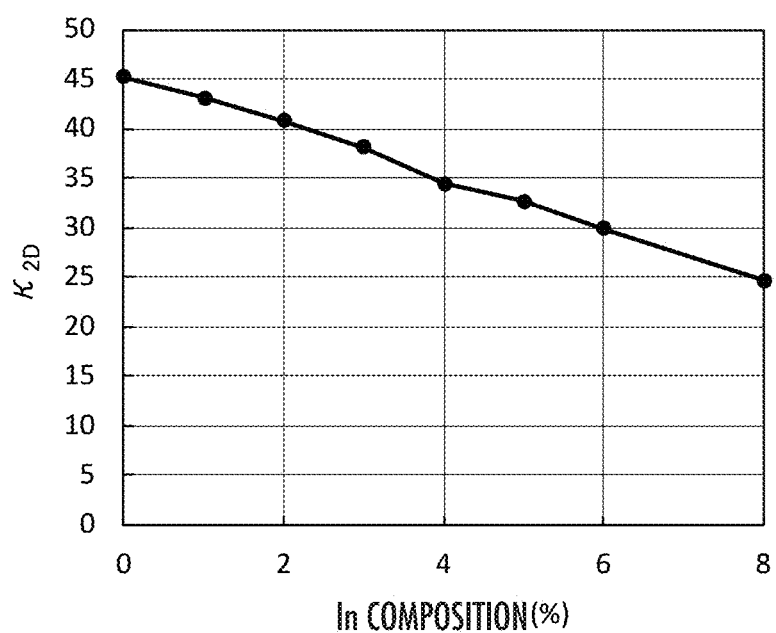

SURFACE-EMITTING LASER DEVICE AND METHOD FOR MANUFACTURING SURFACE-EMITTING LASER DEVICE

CROSS-REFERENCE TO RELATED APPLICATION

This application claims priority to Japanese Patent Application Nos. 2019-226781 filed on Dec. 16, 2019, the entire disclosures of which are incorporated herein by reference.

BACKGROUND OF THE INVENTION

1. Field of the Invention

The present invention relates to a surface-emitting laser device and a method for manufacturing the same. In particular, the present invention relates to a photonic-crystal surface-emitting laser device and a method for manufacturing the same.

2. Description of the Related Art

Photonic-crystal surface-emitting lasers using photonic crystals (PCs) have been developed in recent years. For example, Patent Literature 1 discloses a semiconductor laser device intended for manufacturing without fusion bonding. Patent Literature 2 discloses a manufacturing method for manufacturing a fine structure of a photonic crystal in a GaN-based semiconductor.

Non-Patent Literature 1 discloses a manufacturing process of an air hole PC structure in a GaN-based semiconductor and a manufacturing process of a photonic-crystal surface-emitting laser (PCSEL).

Non-Patent Literature 2 discloses the manufacture of a photonic crystal by increasing a lateral growth rate by low pressure growth. Non-Patent Literature 3 discloses an in-plane diffraction effect and a threshold gain difference of a photonic-crystal laser. Non-Patent Literature 4 discloses a three-dimensional coupled-wave model of a square lattice photonic-crystal laser.

CITATION LIST

Patent Literature

Patent Literature 1: Japanese Patent No. 5082447
Patent Literature 2. Japanese Patent No. 4818464

Non-Patent Literature

Non-Patent Literature 1: Hideki Matsubara et al.: Science Vol. 319, pp. 445-447 (25 Jan. 2008)
Non-Patent Literature 2: H. Miyake et al.: Jpn. J. Appl. Phys. Vol. 38 (1999), pp. L1000-L1002
Non-Patent Literature 3: Tanaka et al.: Japanese Society of Applied Physics Autumn Meeting 2016 preprints, 15p-B4-20
Non-Patent Literature 4: Y. Lian et al.: Phys. Rev. B Vol. 84 (2011) 195119

SUMMARY OF THE INVENTION

Technical Problem

To form a photonic crystal layer in a photonic-crystal surface-emitting laser, holes formed in the surface need to be embedded by regrowth. Conventional techniques have a problem that the embedded holes (or air holes) vary in size and shape. For example, in a method where $SiO_2$ is deposited at the bottom of the air holes for growth inhibition as described in Non-Patent Literature 1, nonuniformity in the coverage of $SiO_2$ at the air hole bottoms causes nonuniform air-hole sizes.

If the air holes included in the photonic crystal of the photonic-crystal surface-emitting laser are nonuniform in size, the periodicity of the refractive index distribution is locally disturbed to scatter light and cause an optical loss. In other words, there has been a problem that the resonator loss of the photonic-crystal surface-emitting laser increases with a significant increase in the oscillation threshold current density.

The present invention has been achieved in view of the foregoing, and an object thereof is to provide a photonic-crystal surface-emitting laser including a photonic crystal having extremely uniform air-hole sizes, and a method for manufacturing the same.

Another object of the present invention is to provide a photonic-crystal surface-emitting laser where variations in the size and shape of air holes included in a photonic crystal layer can be suppressed to reduce a scattering loss in the photonic crystal layer and that can thus oscillate at a low threshold current density, and a method for manufacturing the same.

Yet another object of the present invention is to provide a photonic-crystal surface-emitting laser where an active layer grown on a photonic crystal layer has high quality and crystallinity and that can oscillate at a low threshold current density, and a method for manufacturing the same.

Solution to Problem

A method for manufacturing a surface-emitting laser device according to one aspect of the present invention is a manufacturing method for manufacturing a surface-emitting laser device made of a GaN-based semiconductor by an MOVPE method, the manufacturing method including steps of;

(a) growing a first cladding layer of a first conductive type on a substrate, with a {0001} plane as a growth plane;
(b) growing a guide layer on the first cladding layer;
(c) forming holes in a surface of the guide layer by etching, the holes being two-dimensionally periodically arranged within a plane parallel to the guide layer;
(d) etching the guide layer by using an etchant having selectivity to the {0001} plane and a {10–10} plane of the guide layer;
(e) supplying a gas containing a nitrogen source to cause mass transport without supplying a group-III material gas, and then supplying the group-Ill material gas for growth, whereby a first embedding layer closing openings of the holes is formed to form a photonic crystal layer; and
(f) growing an active layer and a second cladding layer of a second conductive type in this order on the first embedding layer, the second conductive type being opposite to the first conductive type.

A surface-emitting laser device according to another aspect of the present invention is a surface-emitting laser device made of a GaN-based semiconductor, including:
a first cladding layer of a first conductive type:
a photonic crystal layer formed on the first cladding layer, the photonic crystal layer including air holes two-dimensionally periodically arranged within a plane parallel to the photonic crystal layer;

a first embedding layer formed on the photonic crystal layer to close the air holes;

a second embedding layer crystal-grown on the first embedding layer;

an active layer formed on the second embedding layer; and a second cladding layer of a second conductive type formed on the active layer, the second conductive type being opposite to the first conductive type, wherein the air holes in the photonic crystal layer have a diameter distribution including a unimodal distribution with a standard deviation (σ) of 1 nm or less, and a proportion of the air holes belonging to the unimodal distribution to all the air holes is 80% or higher.

BRIEF DESCRIPTION OF THE DRAWINGS

FIG. 2A is a plan view schematically showing a top surface of the photonic-crystal laser (PCSEL) 10;

FIG. 2B is a cross-sectional view schematically showing a cross section of the photonic crystal layer 14P along a plane (cross section taken along line A-A in FIG. 1B) parallel to an n-guide layer 14;

FIG. 2C is a plan view schematically showing a bottom surface of the photonic-crystal laser (PCSEL) 10;

FIG. 4 is a chart showing a diameter distribution of the holes CH;

FIG. 11C is a histogram showing a diameter distribution of air holes 14K;

FIG. 14 is a chart showing a distribution of air hole diameters after the formation of an embedding layer 14B according to the third embodiment;

FIG. 17 is a cross-sectional view schematically showing an example of a structure (second PCSEL structure) of a PCSEL device 30 according to a fourth embodiment;

FIG. 20A is a chart showing a one-dimensional optical coupling coefficient $\kappa_{1D}$ with respect to an In composition;

FIG. 20B is a chart showing a two-dimensional optical coupling coefficient $\kappa_{2D}$ with respect to the In composition;

DETAILED DESCRIPTION OF THE INVENTION

Figure 1A:
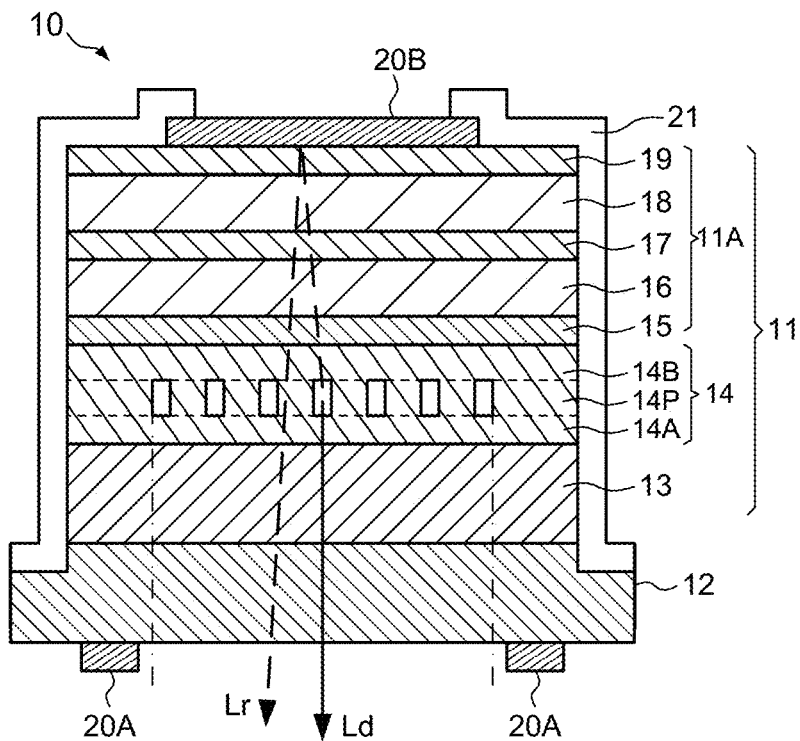
FIG. 1A is a cross-sectional view schematically showing an example of a structure of a photonic-crystal layer (PC-SEL) 10.

While preferred embodiments of the present invention will be described below, such embodiments may be modified or combined as appropriate. In the following description and the accompanying drawings, substantially the same or equivalent portions are denoted by the same reference numerals.

[Structure of Photonic-Crystal Surface-Emitting Laser]

A photonic-crystal surface-emitting laser (hereinafter, also referred to a PCSEL) includes a resonator layer in a direction parallel to a semiconductor light-emitting structure layer (n-guide layer, light-emitting layer, and p-guide layer) constituting a light-emitting element, and emits light coherent in a direction orthogonal to the resonator layer.

There has been known a distributed Bragg reflector (DBR) laser including a pair of resonator mirrors (Braggs reflectors) sandwiching a semiconductor light-emitting layer. The photonic-crystal surface-emitting laser (PCSEL) is different from the DBR laser in the following point: In the photonic-crystal surface-emitting laser (PCSEL), light waves propagating within a plane parallel to the photonic crystal layer are diffracted by the diffraction effect of the photonic crystal to form a two-dimensional resonant mode, and are diffracted in a direction perpendicular to the parallel plane as well. In other words, the light extraction direction is perpendicular to the direction of resonance (within the plane parallel to the PC layer).

FIG. 1A is a cross-sectional view schematically showing an example of a structure (first PCSEL structure) of a photonic-crystal laser (PCSEL) 10. As shown in FIG. 1A, a semiconductor structure layer 11 is formed on a substrate 12. The semiconductor structure layer 11 is made of a hexagonal nitride semiconductor. For example, the semiconductor structure layer 11 is made of a GaN-based semiconductor.

More specifically, an n-cladding layer (first cladding layer of a first conductive type) 13, an n-guide layer (first guide layer) 14, an active layer 15, a p-guide layer (second guide layer) 16, an electron blocking layer (EBL) 17, a p-cladding layer (second cladding layer of a second conductive type) 18, and a p-contact layer 19 are formed on the substrate 12 in this order as the semiconductor structure layer 11. While the following description deals with a case where the first conductive type is n type and the second conductive type is p type opposite to the first conductive type, the first and second conductive types may be p and n types, respectively.

The n-guide layer 14 includes a lower guide layer 14A, a photonic crystal layer (air hole layer or PC layer) 14P, and an embedding layer 14B.

As employed herein, "n-" and "p-" refer to "n side" and "p side", not necessarily to n type or p type. For example, the n-guide layer refers to a guide layer located on the n side of the active layer, and may be an undoped layer (or i layer).

The n-cladding layer 13 may include a plurality of layers instead of a single layer. In such a case, all the layers do not need to be n-type layers (n-doped layers), and an undoped layer or layers (i layer(s)) may be included. The same applies to the guide layer 16 and the p-cladding layer 18. All the foregoing semiconductor layers do not necessarily need to be provided. The semiconductor structure layer 11 may have any structure as long as the layer includes at least an n-type semiconductor layer, a p-type semiconductor layer, and an active layer (light-emitting layer) sandwiched therebetween.

An n electrode (cathode) 20A is formed on the back of the substrate 12. A p electrode (anode) 20B is formed on (the top surface of) the p-contact layer 19. The side surfaces of the semiconductor structure layer 11 and the side surfaces of the upper portion of the substrate 12 are coated with an insulating film 21 such as an $SiO_2$ film. The side surfaces of the p electrode 20B and the surface of the p-contact layer 19 are coated with an insulating film 21 so that the rim of the top surface of the p electrode 20B is covered.

Light (direct emission light Ld) directly emitted from the photonic crystal layer 14P and light (reflected emission light Lr) emitted from the photonic crystal layer 14P and reflected by the p electrode 20B are emitted to outside from a light-emitting area 20L (see FIG. 2C) on the back of the substrate 12.

Figure 1B:
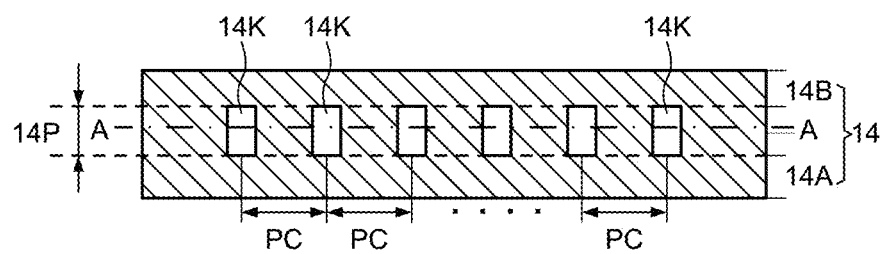
FIG. 1B is an enlarged cross-sectional view schematically showing a photonic crystal layer 14P of FIG. 1A and air holes 14K arranged in the photonic crystal layer 14P.

FIG. 1B is an enlarged cross-sectional view schematically showing the photonic crystal layer 14P of FIG. 1A and air holes 14K arranged in the photonic crystal layer 14P. The air holes 14K are formed and embedded inside the n-guide layer 14. The air holes 14K are two-dimensionally arranged on a crystal growth plane (semiconductor layer growth plane), i.e., a plane (section taken along line A-A in the diagram) parallel to the n-guide layer 14 at the respective positions of square lattice points in a square lattice configuration with a period of PC, for example. The arrangement of the air holes 14K is not limited to the square lattice configuration, and may be any periodical two-dimensional arrangement. Examples thereof may include triangular and hexagonal lattice configurations.

FIG. 2A is a plan view schematically showing the top surface of the photonic-crystal laser (PCSEL) 10. FIG. 2B is a cross-sectional view schematically showing a cross section along a plane (section taken along line A-A in FIG. 1B) parallel to the n-guide layer 14 of the photonic crystal layer (PC layer) 14P. FIG. 2C is a plan view schematically showing the bottom surface of the photonic-crystal laser (PCSEL) 10.

As shown in FIG. 2B, the air holes 14K in the photonic crystal layer 14P are periodically arranged within a rectangular air hole formation area 14R. As shown in FIG. 2C, the n electrode (cathode) 20A is formed as an annular electrode outside the air hole formation area 14R so as not to overlap the air hole formation area 14R when seen in the direction perpendicular to the photonic crystal layer 14P The area inside the n electrode 20A is the light-emitting area 20L. The photonic-crystal laser 10 includes a bonding pad 20C for connecting a feeding wire from outside. The bonding pad 20C is electrically connected to the n electrode 20A.

First Embodiment

1. Manufacturing Steps of Photonic-Crystal Laser (PCSEL) 10

Manufacturing steps of the PCSEL (hereinafter, may be referred to as a PCSEL device) 10 will be described in detail below. The semiconductor structure layer 11 was grown on the substrate (hereinafter, may be referred to as a growth substrate) 12 by normal pressure (atmospheric pressure) growth using an MOVPE (metalorganic vapor phase epitaxy) method as the crystal growth method.

In the steps described below, Sn refers to step n.

The thicknesses, carrier concentrations, group-3 (group-III) and group-5 (group-V) materials, and temperatures described below are only examples unless otherwise specified.

[S1: Substrate Preparation Step]

A +c-plane GaN single crystal with a {0001} plane where Ga atoms were arranged at the outermost surface as its main surface was prepared. The main surface may be a just plane. The substrate may be offset up to 1° or so in an m-axis direction. For example, a substrate offset up to 1° or so in the m-axis direction enables mirror surface growth over a wide range of growth conditions.

The substrate surface (backside) where the light-emitting area 20L was provided opposite the main surface was a "−c"-plane, a (000−1) plane where N atoms were arranged on the outermost surface. The −c-plane is resistant to oxidation etc., and thus suitable for a light extraction surface.

In the present embodiment, an n-type GaN single crystal was used as the substrate (GaN substrate) 12. The n-type GaN substrate 12 has a function as a contact layer with an electrode.

[S2: n-Cladding Layer Formation Step]

As the n-cladding layer 13, a 2-μm-thick n-type AlGaN layer having an Al composition of 4% was grown on the +c-plane GaN substrate 12. The AlGaN layer was grown by supplying trimethylgallium (TMG) and trimethylaluminum (TMA) as group-3 atom sources to the GaN substrate heated to 1100° C.

For carrier doping, silane ($SiH_4$) was supplied simultaneously with the foregoing materials. The carrier concentration at room temperature here was approximately $1 \times 10^{18}$ cm$^{-3}$.

[S3a: Lower Guide Layer and Air-Hole Preparation Layer Formation Step]

Subsequently, TMG was supplied to grow a 250-nm-thick n-type GaN layer as the n-guide layer 14. As with the AlGaN layer, silane ($SiH_4$) was simultaneously supplied for carrier doping. The carrier concentration here was approximately $1 \times 10^{18}$ cm$^{-3}$. The resulting growth layer was a preparation layer for forming the photonic crystal layer 14P in addition to the lower guide layer 14A.

For the sake of simple description and easy understanding, the substrate 12 where such a growth layer is formed (growth layer-containing substrate) may hereinafter be referred to simply as a substrate.

[S3b: Hole Formation Step]

After the formation of the preparation layer, the substrate was taken out of the chamber of the MOVPE apparatus, and fine holes were formed in the surface of the growth layer. After the surface was cleaned, a silicon nitride film ($SiN_x$) was deposited on the clean surface by using plasma CVD. An electron beam drawing resist was applied thereon by spin coating, and a two-dimensional periodic structure was patterned in an electron beam drawing apparatus.

Here, the resist surface was patterned to a two-dimensional array of 100-nm-diameter circular dots in a square lattice configuration with a period of PC=164 nm. After the patterned resist was developed, the $SiN_x$ film was selectively dry etched in an ICP-RIE (inductive coupled plasma reactive ion etching) apparatus. Cylindrical openings arranged in the square lattice configuration with a period of 164 nm were thereby formed through the $SiN_x$ film.

The period (air hole pitch) PC was calculated by PC=λ/n=164 nm, where the emission wavelength λ was 410 nm and the refractive index n of GaN was 2.5.

Subsequently, the resist was removed, and holes were formed in the GaN surface by using the patterned $SiN_x$ film as a hard mask. Cylindrical holes CH were formed in the GaN surface by dry-etching GaN in the ICP-RIE apparatus using a chlorine-based gas and an argon gas. To make a distinction from the air holes (i.e. cavities or vacancies) in the photonic crystal layer 14P, the holes formed in the GaN surface in this step will hereinafter be simply referred to as "holes" or "holes CH".

[S3c: Cleaning Step]

Figure 3A:
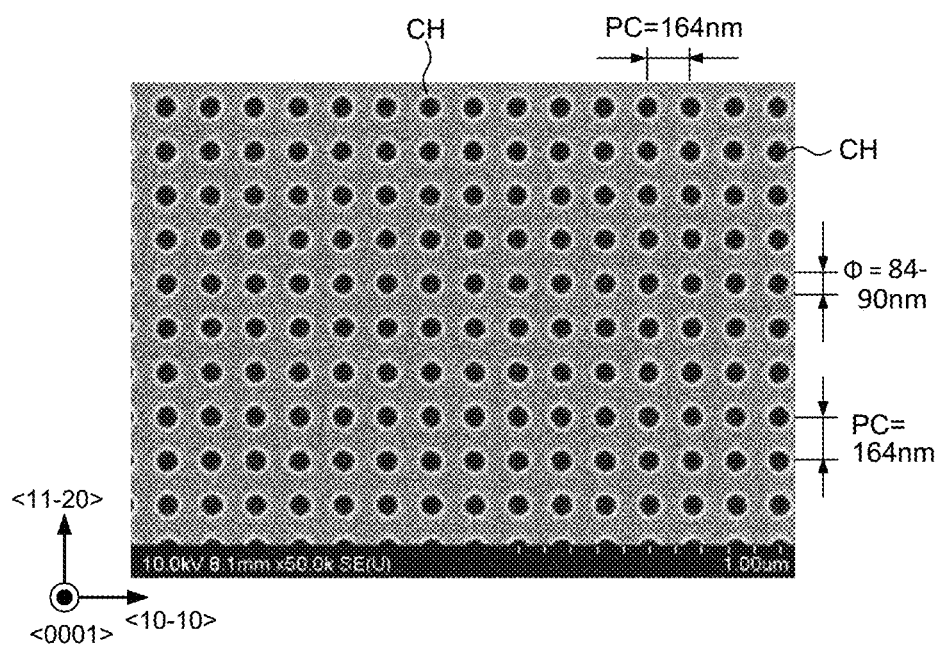
FIG. 3A is a SEM image of a GaN surface after a cleaning step (S3c) according to a first embodiment.
Figure 3B:
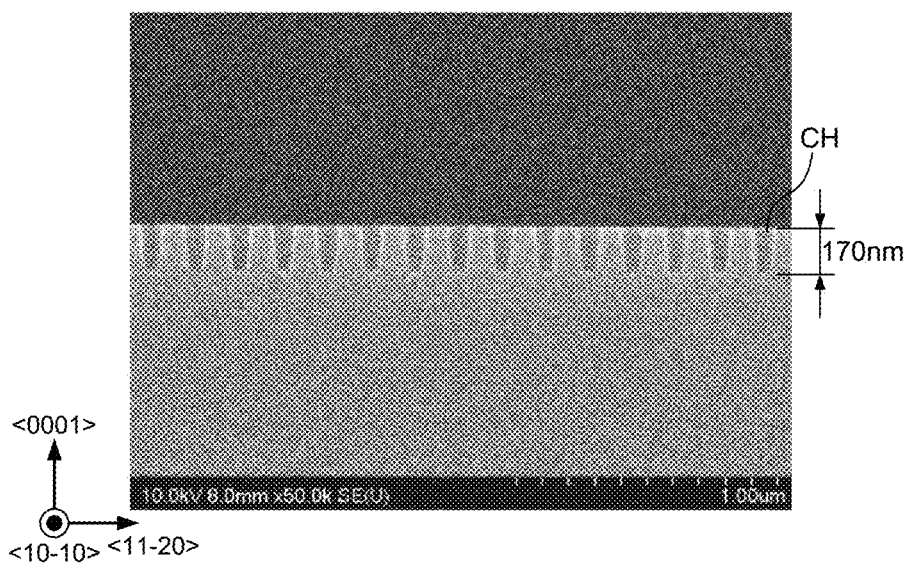
FIG. 3B is a cross-sectional SEM image of holes CH after the cleaning step (S3c) according to the first embodiment.

The substrate in which the holes CH were formed was subjected to degreasing, and then the $SiN_x$ film was removed by using buffered hydrofluoric acid (HF). FIG. 3A shows a SEM (scanning electron microscope) image of the GaN surface here. FIG. 3B shows a cross-sectional SEM image of the holes CH formed in the surface portion.

As shown in the surface SEM image of FIG. 3A, a plurality of holes CH arranged in a square lattice configuration, i.e., two-dimensionally arranged at square lattice points at a pitch (period) PC of 164 nm were formed. The holes CH were top-opening holes with a substantially cylindrical shape. As shown in the cross-sectional SEM image of FIG. 3B, the holes CH in the GaN layer had a depth of approximately 170 nm.

FIG. 4 shows a histogram of the diameters of the holes CH. The holes CH had a diameter distribution of approximately 84 to 90 nm. A normal distribution (broken line in the chart) fitted to the distribution showed an average (Ave) of 86.6 nm and a standard deviation (σ) of 0.92 nm.

[S3d: Embedding Layer Formation Step]

Figure 5A:
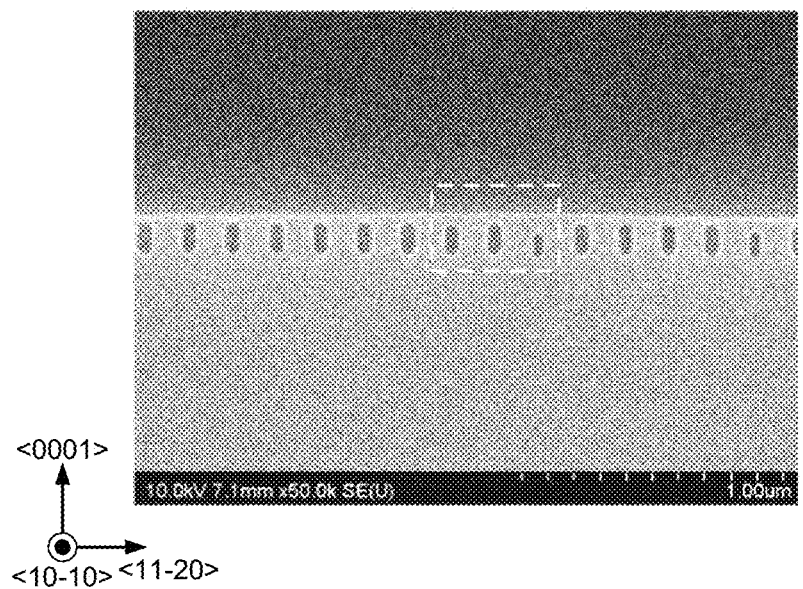
FIG. 5A is a cross-sectional SEM image showing the air holes 14K after the formation of an embedding layer 14B.

The substrate was put into the reactor of the MOVPE apparatus again. $NH_3$ was supplied, the temperature of the substrate was increased to 1100° C., and then TMG and $NH_3$ were supplied to close the holes CH to form the embedding layer 14B. FIG. 5A shows a cross-sectional SEM image of the air holes 14K formed in such a manner.

Figure 5B:
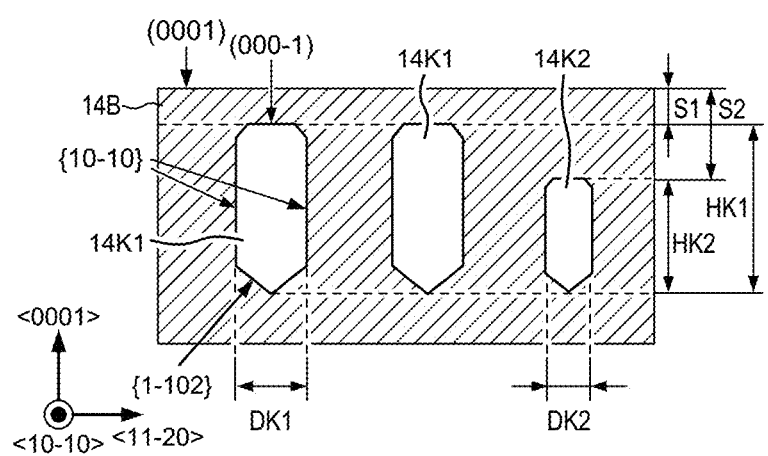
FIG. 5B is a diagram schematically showing the portion surrounded by a broken line in the cross-sectional SEM image of FIG. 5A on an enlarged scale.
Figure 5C:
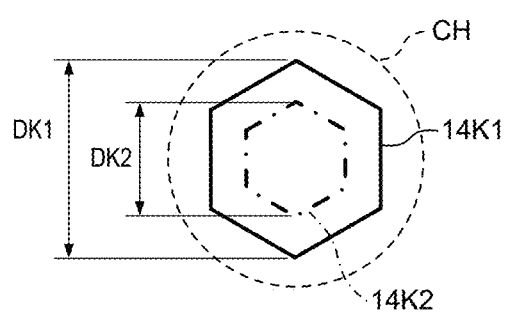
FIG. 5C is a schematic top view of a large air hole 14K1 and a small air hole 14K2.

There were formed large and small, two sizes of air holes 14K1 and 14K2 (hereinafter, the air holes 14K1 and 14K2 will be referred to as air holes 14K if no distinction is made). FIG. 5B is a diagram schematically showing the portion surrounded by a broken line in the cross-sectional SEM image of FIG. 5A on an enlarged scale. FIG. 5B illustrates large and small air holes 14K1 and 14K2. FIG. 5C is a schematic top view of the large and small air holes 14K1 and 14K2.

Figure 5D:
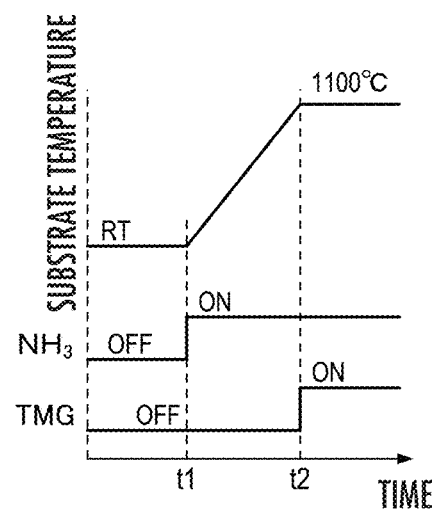
FIG. 5D is a graph showing the sequence of an embedding layer formation step (S3d)

FIG. 5D is a graph showing the sequence of the embedding layer formation step (S3d). In the MOVPE apparatus, the temperature was increased while $NH_3$ was supplied as a nitrogen source, without supplying a group-III material (TMG). The substrate was thereby heated from room temperature (RT) to 100° C., and necks were formed (necking) on the openings of the holes CH by mass transport (times t1 to t2 in FIG. 5D). Nitrogen ($N_2$) was supplied as the atmospheric gas. At time t2, the group-III material (TMG) was supplied to close the holes CH and form the embedding layer 14B by crystal growth.

Here, the holes CH were closed by using a growth mode (vertical growth mode) where crystal growth in the c-axis direction was dominant. The reason was to close the openings of the holes CH while leaving the air holes. For example, the crystal growth in the c-axis direction can be made dominant by increasing the nitrogen content of TMG and the atmospheric gas containing hydrogen and nitrogen other than $NH_3$. Another reason was that if a growth mode (lateral overgrowth mode) where crystal growth in the m-axis direction was dominant was employed, the holes CH could be filled up and the air holes could disappear or decrease in size to lower the uniformity of the embedded air holes.

As shown in FIGS. 5B and 5C, the inner surfaces of the large and small air holes 14K1 and 14K2 were {10−10} facets. The large and small air holes 14K1 and 14K2 were air holes of hexagonal column structure, with air-hole diameters DK1 and DK2 of approximately 60 nm and 40 nm and depths HK1 and HK2 of approximately 120 nm and 80 nm, respectively. There were (000−1) planes at the active layer 15 side (top) of the air holes 14K1 and 14K2, and {1−102} facets at the bottom on the substrate 12 side. The embedding layer 14B was formed in the upper part of the n-guide layer 14, from the plane formed by the tops of the large air holes 14K1 to the surface of the n-guide layer 14.

[S4: Light-Emitting Layer Formation Step]

Next, a multiple quantum well (MQW) layer was grown as the active layer 15, which is the light-emitting layer. The MQW layer included GaN barrier layers and InGaN well layers. The barrier layers were grown by lowering the temperature of the substrate to 820° C. and then supplying triethylgallium (TEG) as a group-3 atom source and $NH_3$ as a nitrogen source. The well layers were grown at the same temperature as with the barrier layers, by supplying TEG and trimethylindium (TMI) as group-3 atom sources and $NH_3$ as a nitrogen source. The center wavelength of PL (photoluminescence) emission from the active layer according to the present embodiment was 412 nm.

[S5: p-Guide Layer Formation Step]

After the growth of the active layer, the temperature of the substrate was increased to 1050° C., and a 110-nm-thick GaN layer was grown as the p-guide layer 16. The p-guide layer 16 was grown by supplying TMG and $NH_3$ without doping with a dopant.

[S6: Electron Blocking Layer Formation Step]

After the growth of the p-guide layer 16, the electron blocking layer (EBL) 17 was grown while maintaining the substrate temperature at 1050° C. The EBL 17 was grown by supplying TMG and TMA as group-3 atom sources and $NH_3$ as a nitrogen source. In addition, $Cp_2Mg$ was supplied as a p-dopant. The EBL 17 having an Al composition of 18% and a thickness of 15 nm was thereby formed.

[S7: p-Cladding Layer Formation Step]

After the growth of the electron blocking layer (EBL) 17, the p-cladding layer 18 was grown while maintaining the substrate temperature at 1050° C. The p-cladding layer 18 was grown by supplying TMG and TMA as group-3 atom sources and $NH_3$ as a nitrogen source. In addition, $Cp_2Mg$ was supplied as a p-dopant. The p-cladding layer 18 having an Al composition of 6% and a thickness of 600 nm was thereby formed. The p-cladding layer (p-AlGaN) 18 had a carrier concentration of $2\times10^1$ $cm^3$ when activated in the $N_2$ atmosphere at 850° C. for 10 minutes after the growth.

[S8: p-Contact Layer Formation Step]

After the growth of the p-cladding layer 18, the p-contact layer 19 was grown while maintaining the substrate temperature at 1050° C. The p-contact layer 19 was grown by supplying TMG as a group-3 atom source and $NH_3$ as a nitrogen source. In addition, $Cp_2Mg$ was supplied as a dopant.

[S9: Electrode Formation Step]

The growth layer-containing substrate on which the formation of the epitaxial growth layers was completed was thinned to a predetermined thickness by a polishing apparatus. A mask was then formed on the p-contact layer 19 side of the substrate to cover the substrate except device isolation grooves, and the resultant was etched until the n-cladding layer 13 or the substrate 12 was exposed. The mask was then removed to form device isolation grooves.

[S10: Electrode Formation Step]

(Formation of Anode Electrode)

To form the p electrode 20B, a palladium (Pd) film and a gold (Au) film were deposited in this order on the surface of the substrate (epitaxial growth substrate) 12 by electron beam deposition. The p electrode 20B was formed by patterning the deposited electrode metal films into 200×200 $\mu m^2$ by photolithography.

(Formation of Cathode Electrode)

Next, the n electrode 20A was formed by depositing Ti and Au in this order on the backside of the substrate 12 by electron beam deposition.

[S11: Protective Film Formation Step]

The bottom surface of the electrode-formed substrate was pasted to a support substrate, and a mask for covering the anode electrode was formed. An $SiO_2$ film serving as a protective film was then formed on the top and side surfaces of the device by sputtering.

[S12: Dicing Step]

Finally, laser scribing was performed along the center lines of the device isolation grooves, whereby a diced PCSEL device (hereinafter, referred to as a PCSEL device or simply as a PCSEL) 10 was obtained.

2. Air Hole Size and Scattering Loss

[Air Hole Size]

Figure 6:
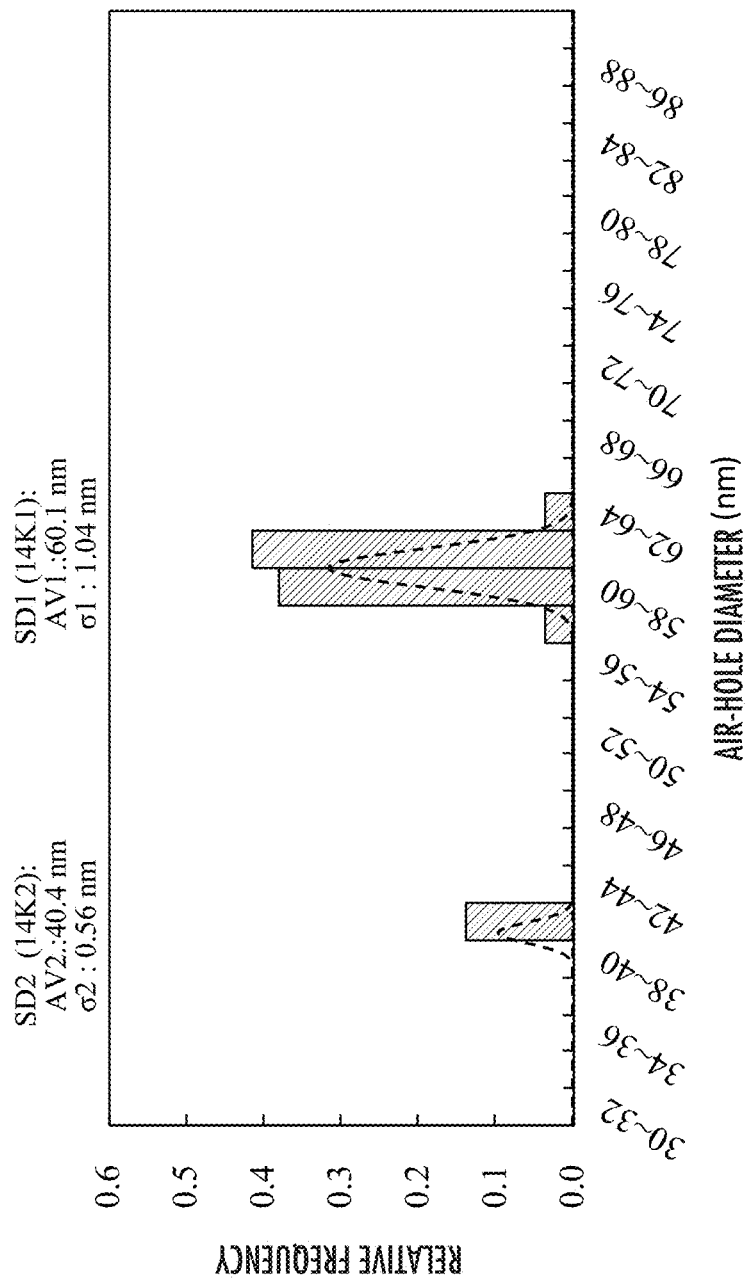
FIG. 6 is a chart showing a distribution of air-hole diameter sizes of the air holes 14K two-dimensionally arranged in the photonic crystal layer 14P after the embedding layer formation step (S3d)

FIG. 6 shows a histogram of air-hole diameter sizes of the air holes 14K two-dimensionally arranged and formed in the photonic crystal layer 14P after the embedding layer formation step (S3d). As described above, the air holes 14K had a hexagonal column shape surrounded by m planes, or {10–10} planes. As employed herein, the air-hole diameter size of an air hole 14K refers to the diameter of the circle circumscribing the hexagon (see FIG. 5C).

As shown in FIG. 6, the distribution of the air-hole diameters of the air holes 14K includes only two distributions with a standard deviation (σ) of 1 nm or less, namely, that of large air holes (first air holes) 14K1 and that of small air holes (second air holes) 14K2. The two distributions are discrete or separate from each other.

As employed herein, each of mutually separate distributions in the entire distribution will be referred to as a unimodal distribution. For example, if the entire distribution is a bimodal distribution, the distributions over the two respective peaks are referred to as unimodal distributions. As employed herein, "separate" unimodal distributions refer to a plurality of unimodal distributions that are separated within the entire distribution of the air hole diameters so that their respective 3a ranges (±3σ) do not overlap, where a is the standard deviation. A unimodal distribution is suitably such that if a normal distribution is fitted thereto, the cumulative frequency of the 3σ range is higher than or equal to 2% of that of the entire distribution.

More specifically, the large air holes (first air holes) 14K1 had a diameter DK1 of 54 to 64 nm and a height or depth (HK1) of 120 nm. A normal distribution (shown by a broken line in the chart) fitted to the unimodal distribution (first unimodal distribution) of the large air holes 14K1 had an average diameter (AV1) of 60.1 nm and a standard deviation (σ1) of 1.04 nm. The small air holes (second air holes) 14K2 had a diameter DK2 of 40 to 42 nm and a height or depth (HK2) of 80 nm. A normal distribution (shown by a broken line in the chart) fitted to the unimodal distribution (second unimodal distribution) of the small air holes 14K2 had an average diameter (AV2) of 40.4 nm and a standard deviation (σ2) of 0.56 nm. The ratio of the frequency distribution (ND) of the large air holes 14K1 to the entire frequency distribution was 80% or higher. The air hole sizes after "S3d: embedding layer formation step" and those after "S8: p-contact layer formation step" were the same.

As shown in FIG. 4, the distribution of the hole diameters of the unembedded holes CH included a single distribution with a standard deviation (ab) of 1 nm or less. As shown in FIG. 6, the distribution of the air hole diameters of the embedded air holes 14K included a unimodal distribution SD1 of the large air holes 14K1 with a standard deviation (σ1) of 1.04 nm, and a unimodal distribution SD2 of the small air holes 14K2 with a standard deviation (σ2) of 0.56 nm. There was a relationship of σb>σ2 and σb≈σ1.

The standard deviations (σ1 and σ2) of the respective unimodal distributions of the air holes 14K1 and 14K2 are determined by the standard deviation (σb) of the diameters of the unembedded holes CH. In other words, the standard deviations (σ1 and σ2) of the air hole diameters after the formation of the embedding layer 14B depend on the formation accuracy of the holes CH.

The standard deviations (σ1 and σ2) of both the unimodal distributions SD1 and SD2 of air hole diameters according to the present embodiment are approximately 1 nm or less. Such values are less than 1/100 the resonant wavelength (=the wavelength in the air/the refractive index=410/2.5) of 164 nm in the GaN layer where the air holes 14K are formed, and thus do not contribute to a light scattering loss.

Next, a relationship between the period PC of the air holes in the air hole layer 14P and the air hole area will be described.

Figure 24:
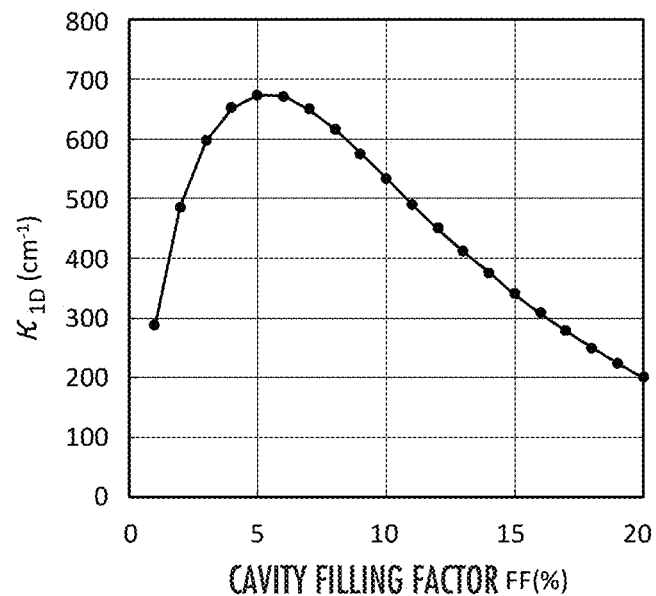
FIG. 24 is a chart showing the one-dimensional optical coupling coefficient $\kappa_{1D}$ with respect to an air-hole filling factor FF.
Figure 25:
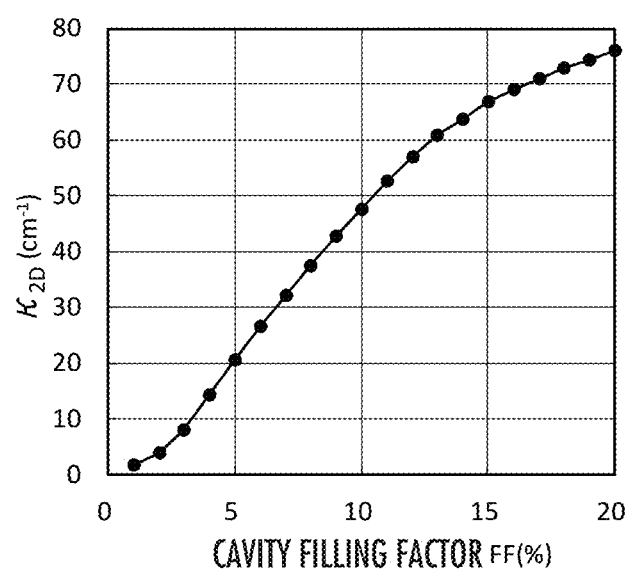
FIG. 25 is a chart showing the two-dimensional optical coupling coefficient $\kappa_{2D}$ with respect to the air-hole filling factor FF.

The percentage of a value obtained by dividing the air hole area seen in a direction orthogonal to the plane of the air hole layer 14P by the square of the air hole period PC will be referred to as an air-hole filling factor FF. FIG. 24 shows a relationship between FF and a one-dimensional coupling coefficient KID determined by the coupled wave theory. FIG. 25 shows a relationship between FF and a two-dimensional coupling coefficient $\kappa_{2D}$.

The one-dimensional coupling coefficient KID of a photonic-crystal laser with a resonator length of around 200 μm increases where FF is 1% to several percent, and decreases where FF is higher (FIG. 24). The two-dimensional coupling coefficient $\kappa_{2D}$ increases as FF increases (FIG. 25).

From the foregoing relationships, FF suitably ranges between 5% to 16%, where the one-dimensional coupling coefficient ID does not fall below 300 cm$^{-1}$, i.e., 1%, and the two-dimensional coupling coefficient $\kappa_{2D}$ has a large value.

In the present embodiment, the small air holes 14K2 have an FF of 3.9%(1060 nm²/26896 nm²) and the large air holes 14K1 have an FF of 8.7% (=2364 nm²/26896 nm²). The large air holes 14K1 are thus desirably dominant. As will be described below, the term "dominant" employed herein refers to that the proportion of the air holes to all the air holes is 95% or more.

[Distances Between Air Holes and Active Layer]

As shown in FIG. 5B, the distance (S2) from the active layer 15 to the plane including the top of a small air hole 14K2 is greater than the distance (S1) from the active layer 15 to the plane including the top of a large air hole 14K1. The planes including the bottoms of the large and small air holes 14K1 and 14K2 on the growth substrate side are located at the same distance from the light-emitting layer.

The smaller the distances from the active layer 15 to the air holes 14K, the higher the interaction between the light generated in the active layer 15 and the photonic band of the photonic crystal layer 14P is and the more the oscillation efficiency can be improved. The more dominant the air holes close to the active layer 15 (large air holes 14K1) are, the more the oscillation efficiency can thus be improved. In addition, since the air hole bottoms on the growth substrate 12 side are located on the same plane, the light scattering loss in the air hole layer can be reduced to improve the oscillation efficiency.

[Large and Small Air Holes and Scattering Loss]

If the photonic crystal layer (air hole layer) 14P of the photonic-crystal surface-emitting laser includes air holes having two separate types of size distributions (i.e., two separate unimodal distributions) as shown in FIG. 6, the scattering loss can be estimated by the coupled wave theory.

Figure 7:
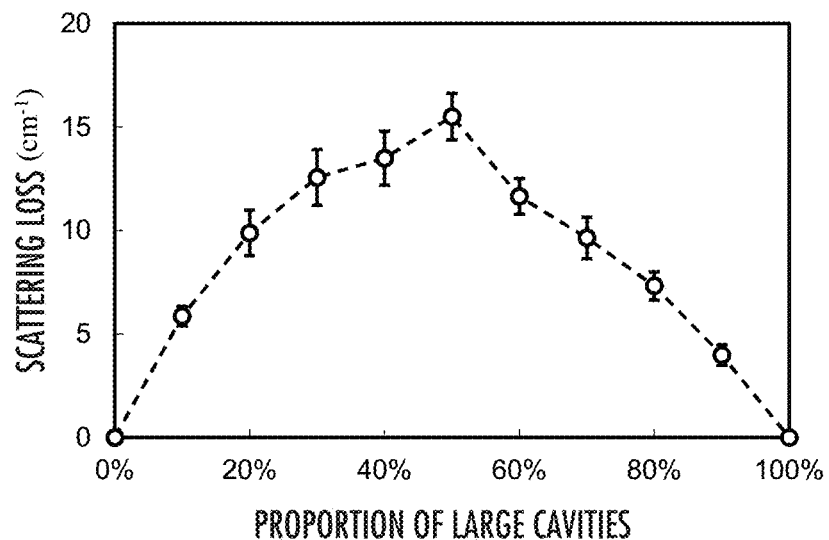
FIG. 7 is a chart showing calculations of a scattering loss with respect to the proportion of large air holes 14K1 in a case where the air holes in the photonic crystal layer 14P have the two types of air-hole size distributions shown in FIG. 6.

FIG. 7 shows calculations of the scattering loss with respect to the proportion of large air holes 14K1 in a case where the air holes in the photonic crystal layer 14P of the PCSEL structure device have the two types of unimodal distributions of air hole sizes shown in FIG. 6. Mixed layout patterns of large and small, two sizes of air holes were generated by using random functions, and the scattering loss was calculated on the assumption that the air holes were two-dimensionally periodically arranged. From the calculations, it can be seen that the light scattering loss can be suppressed up to 15 cm at the maximum by providing at least two sizes of air holes in the photonic crystal layer 14P.

Specifically, if the standard deviation (σ) of air hole diameters is greater than 1 nm or if there are a large number of (three or more) unimodal distributions of air hole diameters, the light scattering loss increases in a complex manner. By contrast, if the number of unimodal distributions of air hole diameters with a standard deviation (σ) of 1 nm or less is two or less, the light scattering loss has a fixed maximum value. If either one type of air holes is dominant, the light scattering loss is reduced. The greater the air hole diameter, the higher the air-hole filling factor and the higher the resonance effect within the plane of the photonic crystal layer 14P. This suppresses higher modes and facilitates single mode oscillation.

In particular, as can be seen from FIG. 7, if the air holes in the photonic crystal layer 14P have two types of unimodal distributions of air hole sizes (14K1 and 14K2) and the proportion of the air holes of either one size to all the air holes is 80% or higher, the light scattering loss is significantly reduced.

It is particularly preferable that the diameter distribution of the air holes 14K has only two mutually separate unimodal distributions having a standard deviation (σ) of 1 nm or less and the proportion of air holes belonging to either one of the unimodal distributions having a greater average air hole diameter to all the air holes is 95% or more. Specifically, this can reduce the scattering loss to 2 cm$^{-1}$.

As employed herein, the number of air holes of either one size (for example, 14K1) refers to the number of air holes falling within the 3σ range (±3σ) of the corresponding unimodal distribution (SD1), with the standard deviation of the unimodal distribution (SD1) as σ.

Suppose now that there are three or more unimodal distributions of air hole diameters with a standard deviation (σ) of 1 nm or less. It has been found that even in such a case, the light scattering loss is greatly reduced if the following condition is satisfied: the total proportion of air holes belonging to two unimodal distributions having higher cumulative frequencies (sums of frequencies in the unimodal distributions) to all the air holes is 95% or more, and the proportion of the number of air holes belonging to the unimodal distribution having the largest average air hole diameter to all the air holes is 85% or more.

[Mechanism of Occurrence of Separate Distributions of Large and Small Air Holes]

Figure 8:
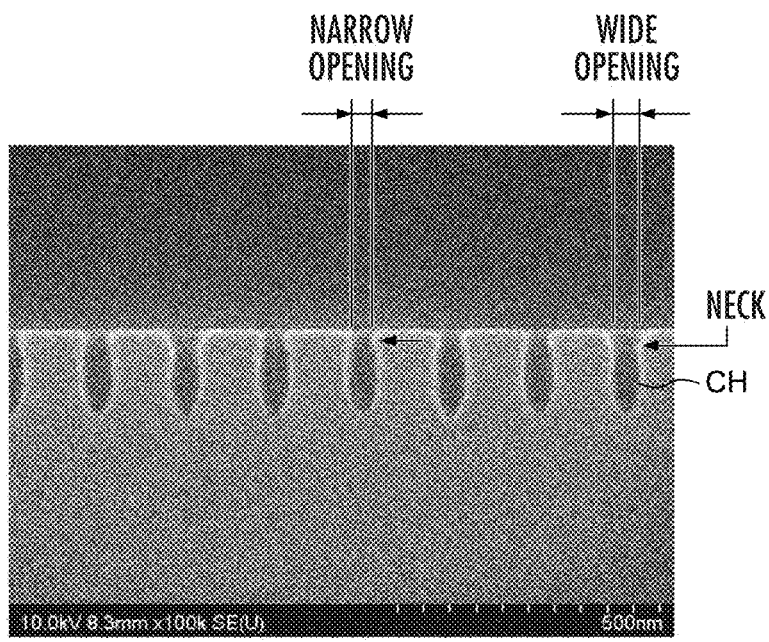
FIG. 8 is a cross-sectional SEM image showing a cross section of air holes for describing a mechanism of occurrence of separate unimodal distributions of large and small air holes.

A mechanism of how the bimodal distribution (distribution including separate unimodal distributions) of large and small air holes occurs has been studied. FIG. 8 is a SEM image showing a cross section of air holes immediately after a temperature increase up to the embedding layer formation temperature of 1100° C. (at a temperature increase rate of 100° C./min) (immediately before the growth of the embedding layer). In such a state, mass transport occurred near the openings of the holes CH heated to 1100° C., and thermally stable facets were formed. At this stage, there were formed two types of holes CH, i.e., ones with a wide opening and ones with a narrow opening. The holes CH with a wide opening had a large neck diameter, and the holes CH with a narrow opening had a small neck diameter.

If the crystal growth of the embedding layer is started in such a state, Ga atoms supplied by the material gas promote growth along the facets. Since the holes CH with a narrow opening are closed earlier, only a small amount of Ga atoms enter the holes CH with a narrow opening. By contrast, the holes CH with a wide opening take a longer time to be closed. A greater amount of Ga atoms is thus supplied into the holes CH with a wide opening, making the air holes 14K smaller in diameter. The holes CH with a wide opening thus form small air holes 14K2, and the holes CH with a narrow opening form large air holes 14K1.

Such a phenomenon is ascribable to etching damage regions that are equally formed around all the holes CH in step S3b (air hole formation step).

The crystal in the etching damage regions of some of the holes CH causes rearrangement in the temperature increase period t1 to t2 (mass transport period). Specifically, holes CH causing rearrangement become holes CH with a wide opening, and holes CH not causing rearrangement become holes CH with a narrow opening. In other words, the holes CH are thereby bipolarized.

The higher the growth temperature (in the growth period after time t2), the higher the rate of occurrence of crystal rearrangement in the damage regions (at a temperature of 1100° C.). The lower the growth temperature, the lower the rate of occurrence. The crystal rearrangement will not occur at or below a rearrangement critical temperature (at or below 900° C. or so) (details will be described in a third embodiment).

[Size Adjustment of Small Air Holes]

As described in the air hole formation step (S3b), the GaN was dry etched in the ICP-RIE apparatus by using a chlorine-based gas and an argon gas, whereby cylindrical holes were formed in the GaN surface. The holes CH were closed (S3d: embedding layer formation step) to form the air holes 14K.

It has been found that the foregoing separate distributions of large and small air holes can be adjusted on the basis of the mechanism of the occurrence of the separate distributions. More specifically, it has been found that the air hole diameter of the small air holes 14K2 can be adjusted by adjusting the bias voltage (attraction voltage) of the ICP-RIE apparatus and the ratio of the chlorine-based gas and the argon gas during dry etching in the apparatus.

In view of this, data on the relationship of the attraction voltage of the ICP-RIE apparatus and the ratio of the chlorine-based gas and the argon gas with the distribution of diameters of the air holes 14K embedded in the photonic crystal layer 14P is obtained in advance. The attraction voltage and the ratio of the chlorine-based gas and the argon gas at which desired separate distributions of large and small air holes are obtained are then selected on the basis of the data on the distribution. The size of the small air holes 14K2 can be adjusted by applying the selected attraction voltage and ratio to the ICP-RIE process in the air hole formation step (S3b).

[Modification]

Figure 26:
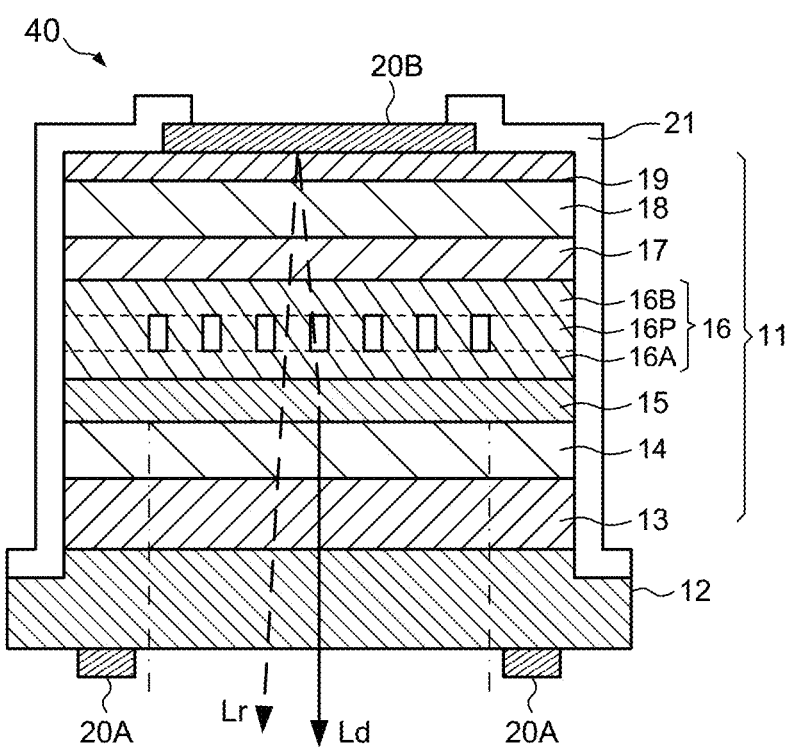
FIG. 26 is a cross-sectional view schematically showing an example of a structure of a photonic-crystal laser (PC-SEL) 40.

FIG. 26 shows a structure of a photonic-crystal laser (PCSEL) 40 that is a modification of the foregoing photonic-crystal laser (PCSEL) 10. Specifically, the photonic-crystal laser (PCSEL) 10 is described to include a photonic crystal layer (PC layer) that is located closer to the substrate 12 than the active layer 15 is. However, the active layer 15 may be located closer to the substrate 12 than the photonic crystal layer is.

More specifically, the active layer 15 is formed on the n-guide layer (first guide layer) 14. The photonic crystal layer is formed in the p-guide layer (second guide layer) 16 on the active layer 15.

Specifically, the p-guide layer 16 includes a lower guide layer 16A, a photonic crystal layer (air hole layer or PC layer) 16P, and an embedding layer 16B. The electron blocking layer (EBL layer) 17, the p-cladding layer 18, and the p-contact layer 19 are formed in this order on the p-guide layer 16.

Each of the semiconductor layers may include a plurality of layers instead of a single layer. In such a case, like the PCSEL 10 described above, all the layers do not need to be doped layers and may include an undoped layer or layers (i layer(s)). Like the PCSEL 10 described above, all the semiconductor layers described above do not necessarily need to be provided, either.

Light (direct emission light Ld) directly emitted from the photonic crystal layer 16P and light (reflected emission light Lr) emitted from the photonic crystal layer 16P and reflected by the p electrode 20B are emitted to outside from the light emission area 20L (see FIG. 2C) on the back of the substrate 12, which transmits the light Ld and Lr emitted from the photonic crystal layer 16P.

[Manufacturing Steps of Photonic-Crystal Laser (PCSEL) 40]

The manufacturing steps of the PCSEL 40 are similar to those of the PCSEL 10. Note that in the manufacturing steps of the PCSEL 40, the three steps, namely, step S3b (hole formation step), step S3c (cleaning step), and step S3d (embedding layer formation step) are not performed in the step S3a (lower guide layer and air-hole preparation layer formation step). Instead, in the manufacturing steps of the PCSEL 40, the three steps S3b, S3c, and S3d are performed after step S5 (p-guide layer formation step).

Second Embodiment

Another method for adjusting the separate distributions of air holes will be described in detail below. Differences from the foregoing first embodiment will be described.

Specifically, in the foregoing step S3c (cleaning step), after the removal of the SiN film, the substrate was immersed in a semiconductor cleaning solution (Furuuchi Chemical: Semicoclean 23) containing approximately 1% of tetramethylammonium hydroxide (TMAH) for 10 minutes, and then washed in water.

Figure 9A:
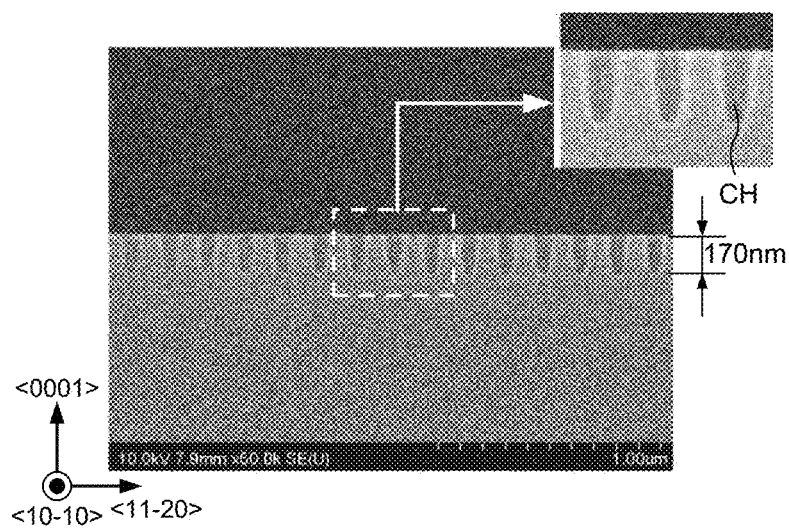
FIG. 9A is a cross-sectional SEM image of the surface portion of an n-GaN layer after a TMAH cleaning step according to a second embodiment.
Figure 9B:
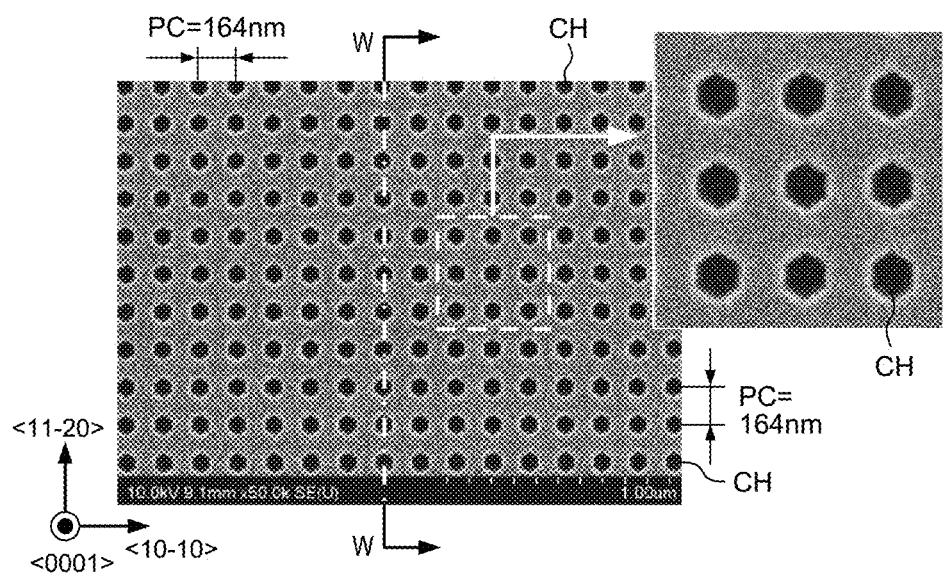
FIG. 9B is a SEM image of the surface of the n-GaN layer after the TMAH cleaning.
Figure 9C:
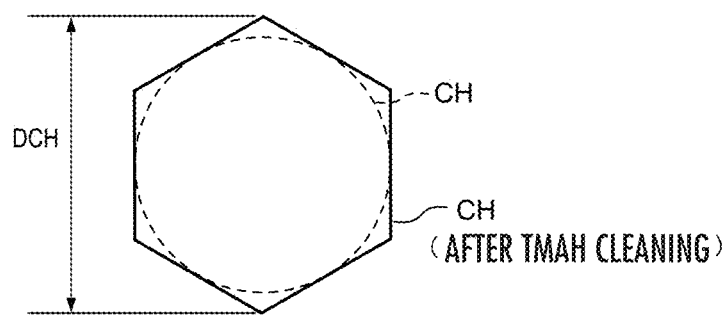
FIG. 9C is a diagram schematically showing the top of a hole CH before the TMAH cleaning (broken line) and after the TMAH cleaning (solid line)

FIGS. 9A and 9B show a cross-sectional SEM image of the surface portion of the n-GaN layer and a SEM image of the surface after the TMAH cleaning, respectively. FIG. 9A shows a cross section taken along line W-W shown in FIG. 9B. FIGS. 9A and 9B also show a partially enlarged SEM image on the upper right of the respective SEM images. FIG. 9C is a diagram schematically showing the top of a hole CH before the TMAH cleaning (broken line) and after the TMAH cleaning (solid line).

Figure 10:
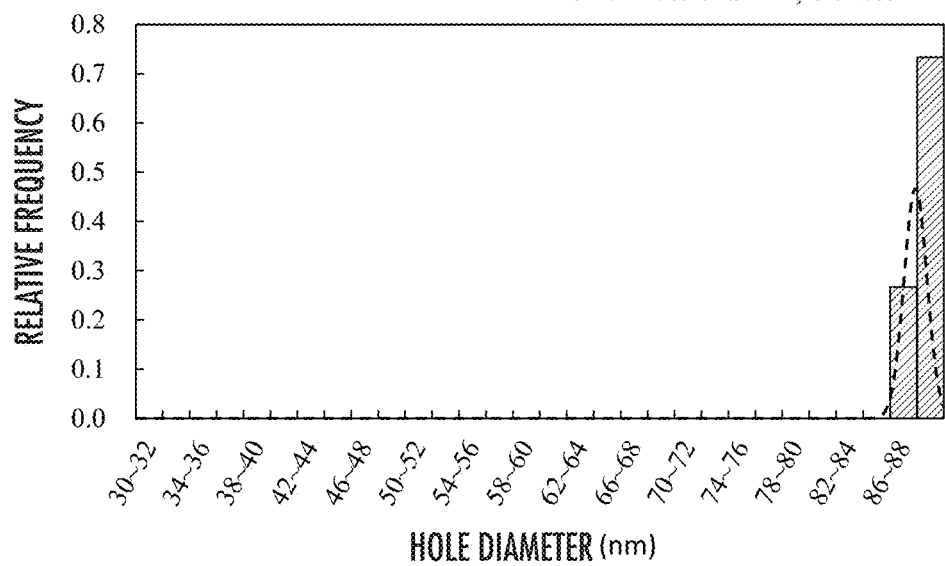
FIG. 10 is a chart showing a distribution of diameters DCH (diagonal lengths) of holes CH.

FIG. 10 shows a distribution of diameters DCH (diagonal lengths) of the holes CH. The TMAH-cleaned holes CH had a hexagonal column shape surrounded by {10-10} planes, with a diameter DCH=86 to 90 nm and a depth of 170 nm. The diameters DCH had a single distribution with an average diameter of 87.9 nm and a standard deviation ($\sigma$) of 0.85 nm.

Figure 11A:
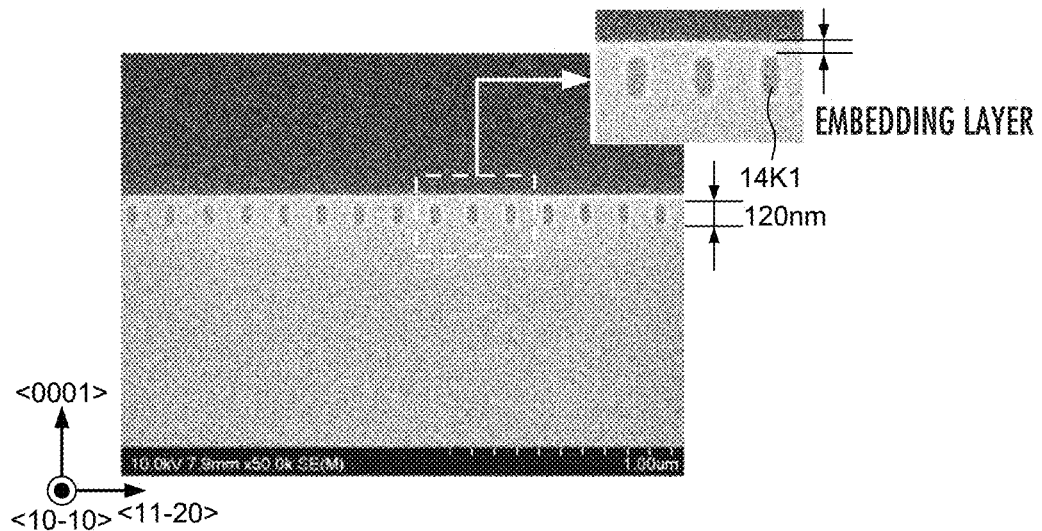
FIG. 11A is a cross-sectional SEM image of the surface portion of an n-GaN layer after the formation of an embedding layer.
Figure 11B:
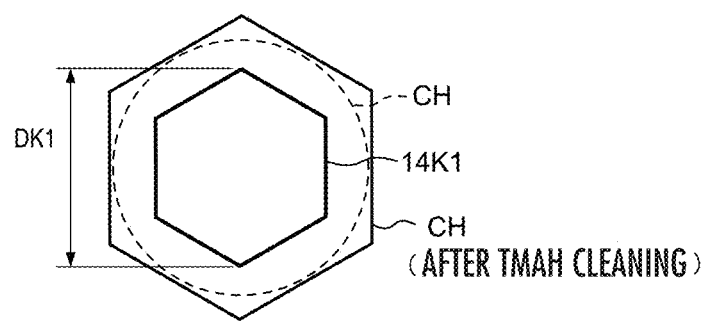
FIG. 11B is a diagram schematically showing the top of a hole CH before TMAH cleaning (broken line) and after the TMAH cleaning (solid line)

After the TMAH cleaning, step S3*d* (embedding layer formation step) was performed. The embedding layer formation was performed by the same method as in the first embodiment. FIG. 11A shows a cross-sectional SEM image of the surface portion of the n-GaN layer after the formation of the embedding layer. FIG. 11B is a diagram schematically showing the top of a hole CH before the TMAH cleaning (broken line) and after the TMAH cleaning (solid line). FIG. 11C is a histogram showing the diameter distribution of the air holes 14K.

As shown in FIG. 11B, the air holes embedded after the TMAH cleaning, or equivalently, the air holes 14K formed in the photonic crystal layer 14P were large air holes 14K1 of hexagonal column shape surrounded by m planes, or {10–10} planes. As shown in FIGS. 11A and 11C, the air holes had a diameter DK1 of 52 to 58 nm, a depth of 120 nm, and a single distribution with an average diameter (AV1) of 55.3 nm and a standard deviation ($\sigma$1) of 0.90 nm. In other words, there was only one unimodal distribution with a standard deviation of 1 nm or less (i.e., the entire distribution was unimodal).

As employed herein, for ease of description and understanding, the air holes 14K formed in the photonic crystal player 14P will be referred to as air holes of single distribution or air holes of single size if the air hole diameters have a unimodal distribution.

The standard deviation ($\sigma$1) of the air holes 14K1 was 0.90 nm, and the standard deviation of the unembedded holes CH was 0.85 nm. This shows that the standard deviation ($\sigma$1) of the air holes 14K1 depends on the standard deviation of the unembedded holes CH. The air-hole filling factor FF was $(3 \times 3^{1/2}/8 \times DK^2)/PC^2 = 1986$ nm$^2$/26896 nm$^2$=7.4%, i.e., in the preferable range of 5% to 16%.

Since the air holes 14K formed in the photonic crystal layer 14P are air holes 14K1 of single size, both the distance from the active layer 15 to the plane including the top faces of the air holes 14K and the distance from the active layer 15 to the plane including the apexes of the air holes 14K on the substrate side are constant. The interaction between the light generated in the active layer 15 and the photonic band of the air hole layer can thereby be strengthened to provide a high resonance effect.

Figure 12A:
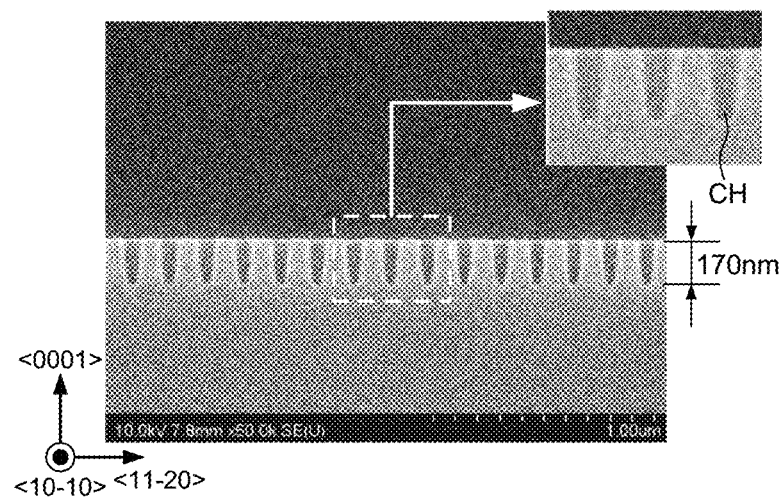
FIG. 12A is a cross-sectional SEM image of the surface portion of an n-GaN layer after KOH cleaning.
Figure 12B:
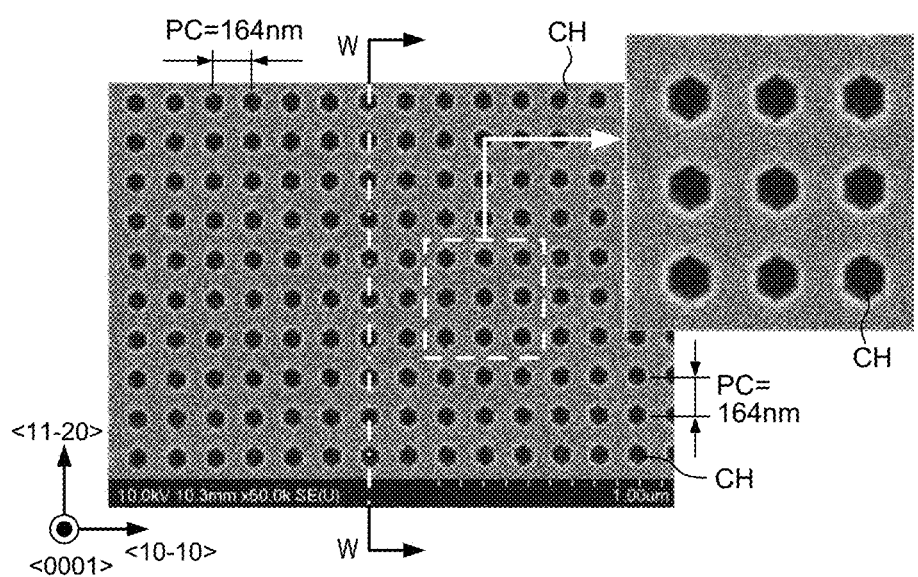
FIG. 12B is a SEM image of the surface of the n-GaN layer after the KOH cleaning.

While the foregoing description has dealt with the case of using a TMAH aqueous solution, a potassium hydroxide (KOH) aqueous solution may be used instead of the TMAH aqueous solution. FIGS. 12A and 12B show a sectional SEM image of the surface portion of the n-GaN layer and a SEM image of the surface after KOH cleaning. The KOH aqueous solution also has etching selectivity to the {0001} and {10–10} planes of GaN crystal.

Figure 12C:
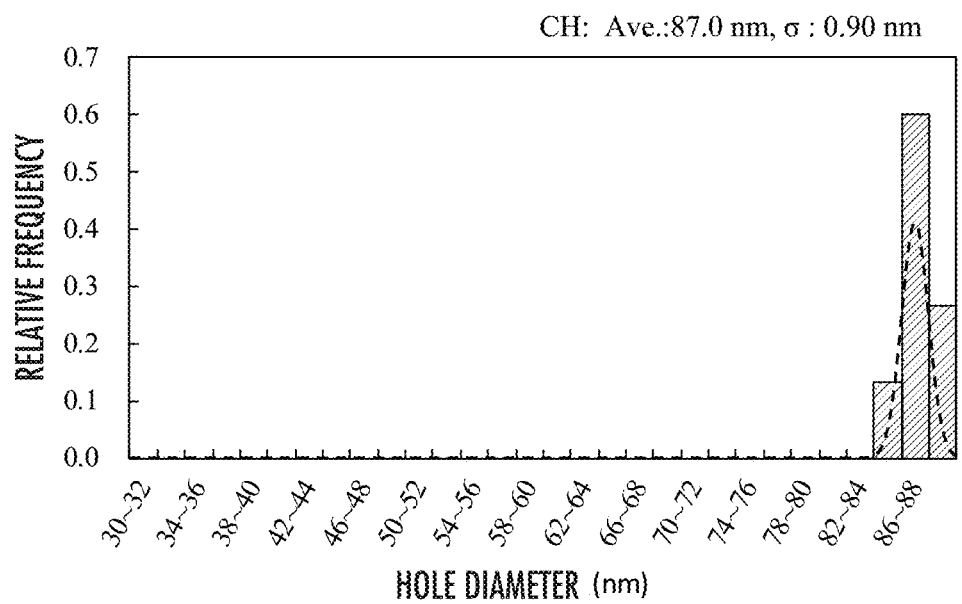
FIG. 12C is a chart showing a distribution of diameters DCH of holes CH after the KOH cleaning.

As with the TMAH aqueous solution, the holes CH after the KOH cleaning had a hexagonal column shape surrounded by {10–10} planes, with a diameter DCH=84 to 90 nm and a depth of 170 nm. As shown in FIG. 12C, the hole diameters had a single distribution (unimodal distribution) with an average diameter of 87.0 nm and a standard deviation ($\sigma$) of 0.90 nm.

The air holes embedded after the KOH cleaning were large air holes 14K1 of hexagonal column shape, surrounded by m planes. The photonic crystal layer 14P including the air holes 14K1 of single distribution with a standard deviation ($\sigma$1) of 1.0 nm or less was thereby obtained.

The air holes formed in the photonic crystal layer 14P particularly preferably have a diameter distribution including only one unimodal distribution with a standard deviation ($\sigma$) of 1 nm or less. The proportion of the air holes belonging to the unimodal distribution to all the air holes is preferably 95% or higher.

Basic cleaning solutions (etchants) other than TMAH (tetramethylammonium hydroxide) may be used as long as the cleaning solutions have etching selectivity to the {0001} and {10–10} planes of GaN crystal as described above. Examples thereof may include organic bases such as TEAH (tetraethylammonium hydroxide) and EDTA (ethylenediaminetetraacetic acid). Alkali metal hydroxides such as LiOH (lithium hydroxide) and NaOH (sodium hydroxide) may be used aside from KOH (potassium hydroxide).

The selective etching using the foregoing cleaning solution can remove damaged layers, whereby only one type of facets are formed in the air holes immediately after the temperature increase.

In the present embodiment, the sides of the holes CH before the growth of the embedding layer are facets of m planes, or {10–10} planes. Since the atoms on the air hole surfaces will not be rearranged in the process of temperature increase in forming the embedding layer, the formation of wide and narrow openings is prevented. The air holes after the formation of the embedding layer thus have a single size.

Third Embodiment

Figure 13:
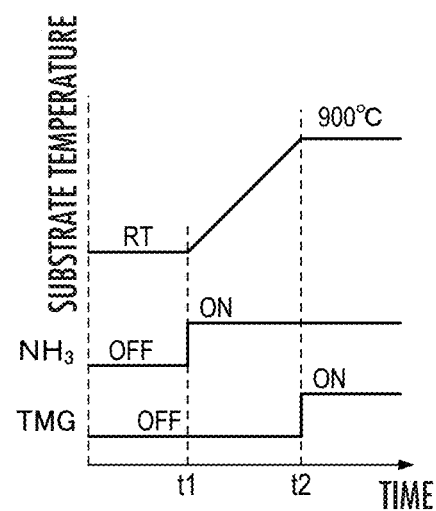
FIG. 13 is a graph for describing a sequence of substrate temperature increase and material supply according to a third embodiment.

A third embodiment is different from the foregoing embodiments in that the temperature of the substrate is increased to 900° C. in step S3*d* (embedding layer formation step). More specifically, in the third embodiment, as shown in the sequence of FIG. 13, in the embedding layer formation step (S3*d*), the temperature of the substrate was increased from room temperature (RT) to 900° C. (times t1 to t2) (a temperature increase rate of 100° C./min) while supplying NH$_3$ without the supply of a group-III material gas. At time t2, the group-III material (TMG) was further supplied to form the embedding layer 14B for embedding the holes CH.

Since the temperature at time t2 was below the rearrangement critical temperature of 950° C., crystal rearrangement in the etching damage regions formed only holes CH with a narrow opening (necking portion) during the temperature increase between times t1 and t2. At and after time t2, the hole openings were closed by crystal growth due to the supply of the group-III material (TMG).

The air holes after the formation of the embedding layer 14B were thus air holes 14K1 of hexagonal column shape, surrounded by facets having a low dangling bond density where the surface energy was low, i.e., {10–10} planes. As shown in FIG. 14, the air hole diameters showed a single distribution (i.e., unimodal distribution). Specifically, the air holes 14K1 had a diameter DK1 of 62 to 68 nm, a depth of 100 nm, and a single distribution of diameters with an average diameter (AV1) of 65.1 nm and a standard deviation ($\sigma$1) of 0.91 nm.

In the present embodiment, air holes 14K having a unimodal distribution of air hole diameters are formed. The reason is that, as described above, the mechanism of occurrence of a plurality of separate unimodal distributions of large and small air holes is ascribable to the occurrence of crystal rearrangement in the etching damage regions formed around the holes CH.

In the present embodiment, the growth temperature of the embedding layer is as low as 900° C. This suppresses crystal rearrangement in the etching damage regions around the openings of the cylindrical holes CH formed in the air hole formation step (step S3*b*). In the resulting facets, crystal planes hexagonally rearranged at this low temperature, namely, {10–11} planes are dominant.

To obtain a photonic crystal layer having a single (uniform) distribution of air hole diameters, the growth temperature in the embedding layer formation step is preferably 800° C. to 1000° C., and more preferably 850° C. to 950° C.

Like the first embodiment, the standard deviation of the air hole diameters is determined by the standard deviation ($\sigma b$) of the diameters of the unembedded holes. Specifically, the standard deviation ($\sigma 1$) of the diameters of the air holes 14K1 was 1 nm or less.

The ratio of the air hole diameter to the resonant wavelength was 0.40 (=65.1/164), i.e., in the preferable range of 0.3 to 0.6. The air hole diameter DK1 was the largest (65 nm) among those of the first to third embodiments.

A step of removing damage layers by using the cleaning solution (selective etchant) according to the second embodiment may be used as well.

[Light-Emitting Characteristics of PCSEL Device]

Figure 15A:
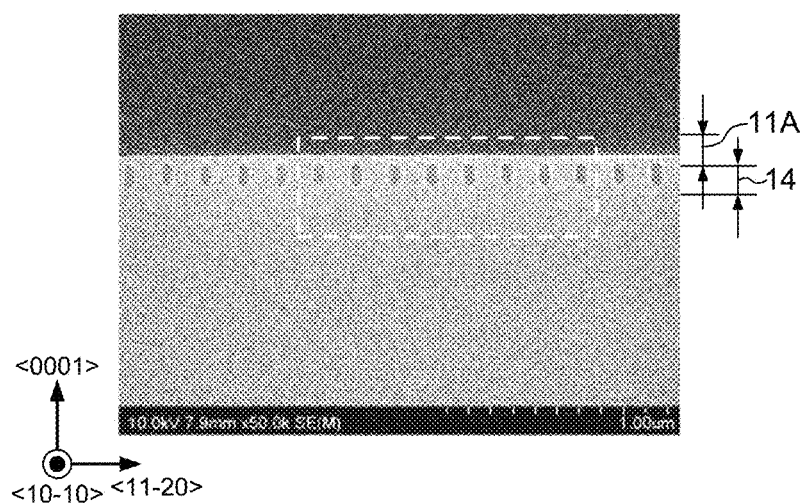
FIG. 15A is a cross-sectional SEM image of a PCSEL 10.
Figure 15B:
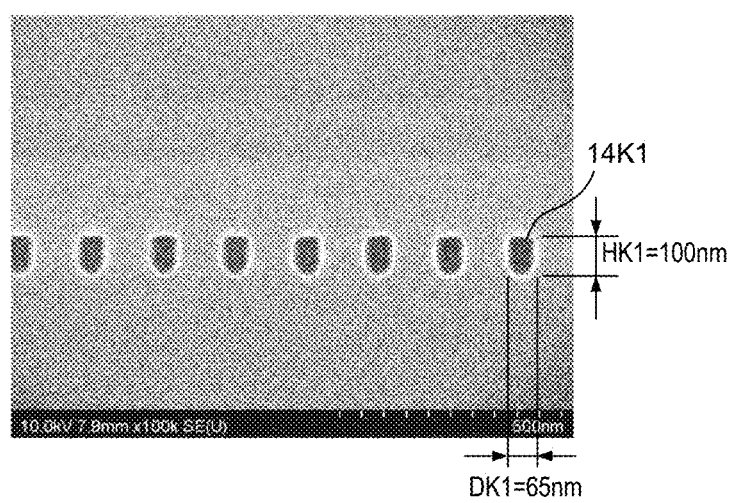
FIG. 15B is an enlarged partial cross-sectional SEM image of a photonic crystal layer (PC layer) 14P.

After the formation of the embedding layer 14B according to the third embodiment, steps S4 to S12 were performed to obtain the PCSEL 10. FIGS. 15A and 15B are a cross-sectional SEM image of the PCSEL 10 and an enlarged cross-sectional SEM image of the photonic crystal layer (PC layer) 14P, respectively.

As shown in FIG. 15A, a semiconductor layer 11A was formed on the n-guide layer 14 including the photonic crystal layer (PC layer) 14P. The semiconductor layer 11A included the active layer 15, the p-guide layer 16, the EBL 17, the p-cladding layer 18, and the p-contact layer 19 in this order.

As shown in FIG. 15B, the air holes 14K1 in the photonic crystal layer (PC layer) 14P had a depth (height) HK1 of approximately 100 nm and a air hole diameter DK1 of approximately 65 nm.

(1) Distance Between Air Holes and Light-Emitting Layer

Like the second embodiment, the diameters of the air holes 14K1 showed a single distribution (unimodal distribution) of extremely high uniformity. The top apexes of the air holes 14K1 in the photonic crystal layer 14P were located on the same plane, and the substrate-side apexes were located on the same plane as well. Since all such faces are located at constant distances from the active layer 15, a high resonance effect can be obtained.

(2) Relationship Between Current Density and Light Output

Figure 16A:
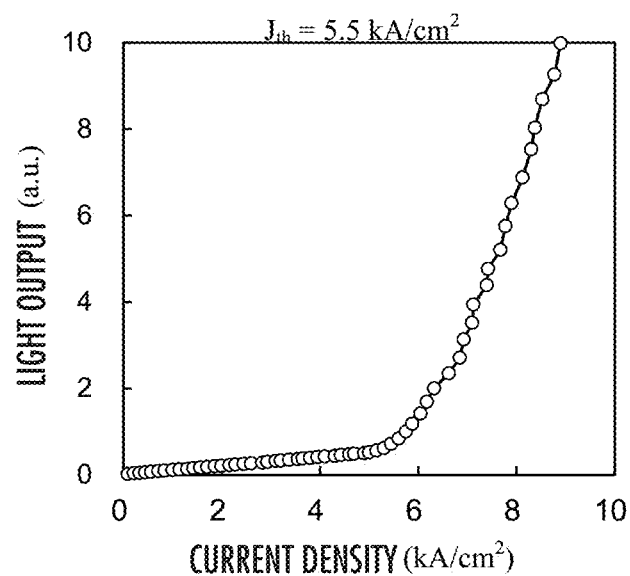
FIG. 16A is a chart showing a relationship between the current density and light output of the PCSEL 10.
Figure 16B:
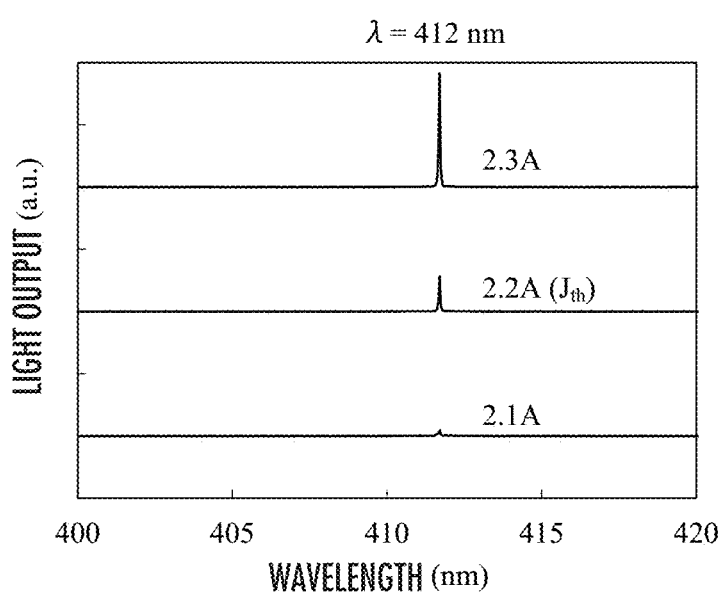
FIG. 16B is a chart showing the oscillation wavelength of the PCSEL 10.

FIG. 16A shows a relationship between the current density and the light output (peak value) of the PCSEL 10 (I-L characteristic). FIG. 16B shows the oscillation wavelength.

The PCSEL 10 was observed to produce highly unimodal laser oscillation at a threshold current density of $J_{th}$=5.5 kA/cm$^2$ (current I=2.2 A) by pulsed current driving with a pulse width of 100 ns and a pulse period of 1 kHz. The oscillation wavelength λ was 412 nm, the same as the design value.

This threshold current density $J_{th}$ was greatly reduced compared to the threshold current density of 67 kA/cm$^2$ according to Non-Patent Literature 1. In other words, the light scattering loss ($\alpha_{scat}$) due to nonuniform air hole sizes of the photonic crystal layer 14P was confirmed to be greatly reduced.

(3) Estimation of Oscillation Threshold

Lasers such as a distributed feedback (DFB) laser and a photonic-crystal laser have a periodic structure serving as an optical resonator. The optical loss ($\alpha 0$) of the resonator can be estimated by the coupled wave theory. Using such a method, the optical loss of the PCSEL 10 according to the third embodiment was estimated to be 7.52 cm$^{-1}$. Given the same cladding layer structure as that of a Fabry-Perot semiconductor laser, the internal loss ($\alpha i$) according to the third embodiment was approximately 20 cm$^{-1}$. The total loss according to the third embodiment was thus 27.5 cm$^{-1}$.

To produce laser oscillation, a gain condition needs to be satisfied, i.e., the gain needs to exceed the total loss. Specifically, the following (Eq. 1) needs to be satisfied:

$$\Gamma act \cdot Gs = \alpha 0 + \alpha i, \quad \text{(Eq. 1)}$$

where Γact: optical confinement factor of the active layer. Gs: threshold gain,
$\alpha 0$: optical loss of the resonator determined by the coupled wave theory, and
$\alpha i$: internal loss (absorption loss).

On the basis of the structure of the third embodiment, Γact is estimated to be 3.21%. The threshold gain (Gs) satisfying (Eq. 1) is 857.3 cm$^{-1}$.

Next, the threshold gain of the structure according to Non-Patent Literature 1 will be estimated as an example. By the two-dimensional coupled wave theory, the optical loss ($\alpha 0$) of the resonator is estimated to be 99.7 cm$^{-1}$. Given the same internal loss ($\alpha i$) of 20 cm, the total loss is 119.7 cm$^{-1}$. Since the optical confinement factor (Γact) of the active layer is 1.96%, the threshold gain of the structure according to Non-Patent Literature 1 is 6111.4 cm$^{-1}$. Assuming that the gain is proportional to the current, the threshold current density is determined to be 39 kA/cm$^2$. This value is lower than the actual threshold current density of 67 kA/cm$^2$.

The reason is considered to be that a loss caused by light scattering due to size variations of the air holes in the photonic crystal is added to the optical loss ($\alpha 0$) of the resonator as described above.

In the case of oscillation at a threshold current density of 67 kA/cm$^2$, the threshold gain (Gs) is 10443.8 cm$^1$. The additional scattering loss ($\alpha_{scat}$) according to Non-Patent Literature 1 is thus determined to be 83.9 cm$^{-1}$ (=(10443.8−6111.4)×0.0196). This value is extremely high compared to the scattering loss shown in FIG. 7. It can be seen that the provision of at least two sizes of air holes in the photonic crystal layer can significantly reduce the threshold current density.

Fourth Embodiment

FIG. 17 is a cross-sectional view schematically showing an example of a structure (second PCSEL structure) of a photonic-crystal laser (PCSEL) device 30 according to the fourth embodiment.

The PCSEL device 30 has a similar configuration to that of the PCSEL device 10 shown in FIGS. 1A, 1B, and 2A to 2C. Differences from the PCSEL 10 will be described below.

The PCSEL 30 according to the present embodiment is different from the PCSEL 10 in that a second embedding layer 25 is provided between the n-guide layer 14 and the active layer 15. For the sake of clear description, the embedding layer 14B (topmost layer of the n-guide layer 14) according to the foregoing embodiments may be referred to as a first embedding layer 14B.

(1) Manufacturing Steps of PCSEL 30

Differences from the manufacturing steps of the PCSEL 10 will be described below. The foregoing steps S1 to S3b were performed as in the first embodiment.

[S3c: Cleaning Step (Selective Etching Step)]

Step S3c (cleaning step: selective etching step) similar to that of the second embodiment was performed. Specifically, after the removal of the SiN$_x$ film, the substrate in which the holes CH were formed was immersed in a semiconductor cleaning solution containing approximately 1% of tetramethylammonium hydroxide (TMAH) for 10 minutes, and then washed in water.

[S3d: Embedding Layer (First Embedding Layer) Formation Step]

Step S3d similar to that of the third embodiment was performed. Specifically, as shown in the sequence of FIG. 13, the temperature of the substrate was increased from room temperature (RT) to 900° C. (times t1 to t2) while supplying $NH_3$ without the supply of a group-III material gas. At time t2, the supply of the group-III material gas (TMG) was started to form the first embedding layer 14B for embedding the holes CH.

A photonic crystal layer including air holes 14K1 having a single distribution of air hole diameters was thereby obtained. The standard deviation (σ) of the diameter distribution of the air holes formed in the photonic crystal layer 14P was 1 nm or less.

In the present embodiment, step S3c (selective etching step) similar to that of the second embodiment and step S3d (embedding layer formation step) similar to that of the third embodiment are performed. A photonic crystal layer 14P having air hole sizes of even higher uniformity can thus be obtained than when each of such steps is performed singly.

[S3e: Second Embedding Layer Formation Step]

In the present embodiment, step S3d (first embedding layer formation step) was followed by the formation of the second embedding layer 25.

More specifically, after the formation of the first embedding layer 14B, i.e., the photonic crystal layer 14P, the substrate temperature was lowered to 820° C., and the 20 second embedding layer 25 was formed by supplying triethylgallium (TEG) and trimethylindium (TMI) as group-III atom sources and $NH_3$ as a nitrogen source. The second embedding layer 25 had an In composition of 2% and a thickness of 50 nm.

After step S3e (second embedding layer formation step), steps S4 (light-emitting layer formation step) to S12 (dicing step) were performed as in the foregoing embodiments, whereby the PCSEL device 30 was obtained.

The second embedding layer 25 preferably has a refractive index higher than that of the base material of the photonic crystal layer 14P (in the foregoing embodiments, GaN) and lower than an average refractive index of the active layer 15.

(2) Quality Improvement of Active Layer by Second Embedding Layer 25

Figure 18A:
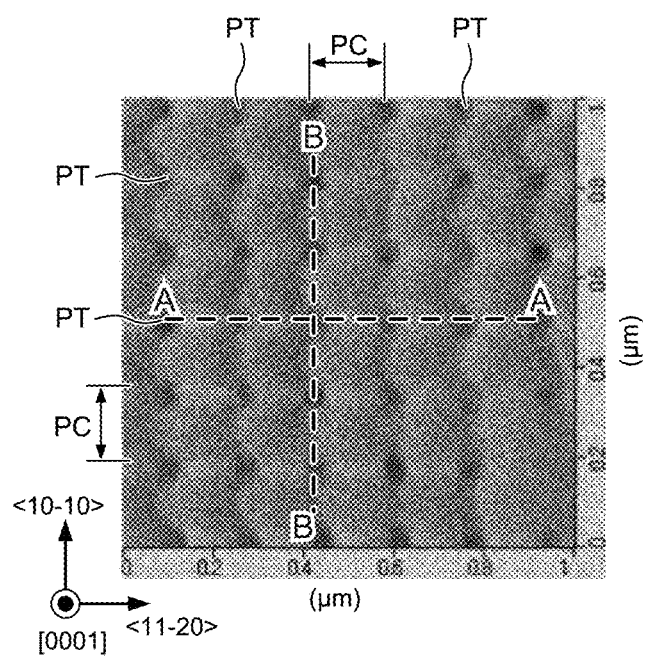
FIG. 18A is an AFM image showing the surface morphology of a first embedding layer 14B.
Figure 18B:
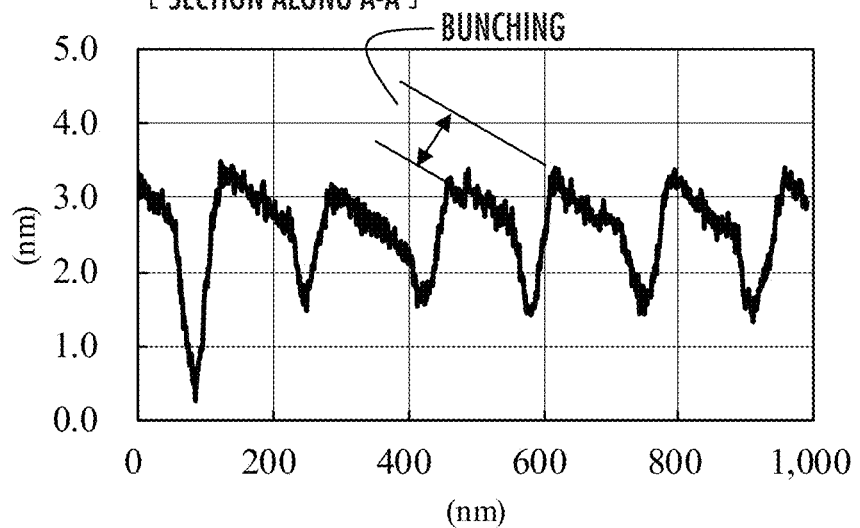
FIG. 18B is a graph showing surface roughness taken along line A-A of FIG. 18A.
Figure 18C:
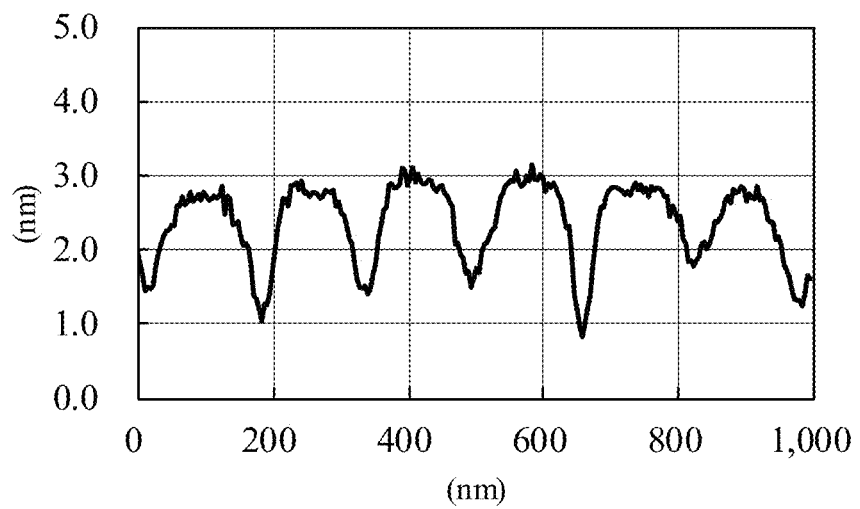
FIG. 18C is a graph showing surface roughness taken along line B-B of FIG. 18A.

FIG. 18A is an atomic force microscope (AFM) image showing the surface morphology of the first embedding layer 14B. FIG. 18B is a graph showing the surface roughness of a cross section taken along line A-A of FIG. 18A. FIG. 18C is a graph showing the surface roughness of a cross section taken along line B-B of FIG. 18A. The surface of the first embedding layer 14B was confirmed to be made of (0001) planes of GaN, with a step terrace structure bunched in widths equivalent to the period of PC (=164 nm).

As shown in FIG. 18A, the surface of the first embedding layer 14B was observed to have pits PT in a square lattice configuration with the periods of the air holes 14K, at surface positions corresponding to the air holes 14K. In other words, the pits PT appeared in a crystal orientation [0001] with respect to the air holes 14K. In the present embodiment, the pits PT were observed to appear at positions overlapping the air holes 14K when the first embedding layer 14A was seen from above.

Specifically, closing and embedding the holes in the crystal causes crystal discontinuity, which results in the occurrence of pits PT. In other words, pits PT derived from or attributable to the air holes 14K appear on the surface of the first embedding layer 14B. If the crystal has a large off angle, the pits PT may not come directly above the air holes 14K when the first embedding layer 14B is seen from above. In any case, the pits PT appear in the crystal orientation [0001] with respect to the air holes 14K.

Note that when the first embedding layer 14B is formed, the pits PT in the surface of the first embedding layer 14B do not need to be perfectly two-dimensionally arranged in a regular array. The first embedding layer 14B has only to be formed of Ga and N supplied by the material source gases in such a surface state that some pits PT remain in the surface of the first embedding layer 14B.

The first embedding layer 14B is not limited to GaN. GaN-based semiconductor crystal layers of other crystals, such as ternary and quaternary crystals, may be formed as the first embedding layer 14B. Such layers preferably have a refractive index higher than that of the n-cladding layer 13. Examples of the usable crystals may include AlGaN with an Al composition lower than that of the n-cladding layer 13, and InGaN.

An active layer of sufficient crystal quality is unable to be grown on the surface of such a first embedding layer 14B. This lowers the internal quantum efficiency, so that a sufficient gain fails to be obtained and the threshold current density increases.

To oscillate the PCSEL device at a low threshold current density, the periodically arranged shallow pits PT need to be planarized before the growth of the active layer on the embedding layer. As shown in FIGS. 18A to 18C, the periodic pits PT remain even after the formation of the embedding layer. Such a surface is considered to be difficult to planarize with a sufficiently small thickness to obtain optical coupling between the active layer and the photonic crystal layer even if planarization using GaN, the same type of material as that of the embedding layer, is attempted.

The addition of In (indium) was thus attempted in planarizing the surface of the first embedding layer 14B. TMI is known to serve as a surfactant in growing a GaN film. In planarizing the shallow pits, the addition of TMI is considered to enhance the surface migration, whereby the surface can be planarized with a sufficiently small thickness.

As shown in FIGS. 18B and 18C, the pits PT have a depth of approximately 2 nm. The second embedding layer 25 grown on the first embedding layer 14B therefore needs to be 2 nm or more in thickness. For sufficient coupling of the light generated in the active layer 15 with the light propagating through the photonic crystal layer 14P, the distance between the active layer 15 and the photonic crystal layer 14P is preferably about 200 nm or less.

For that reason, the second embedding layer 25 preferably has a thickness of 200 nm or less. In the present embodiment, the first embedding layer 14B had a thickness of approximately 100 nm. The thickness of the second embedding layer 25 is thus more preferably 100 nm or less.

(3) Oscillation Characteristic of PCSEL 30

Figure 19A:
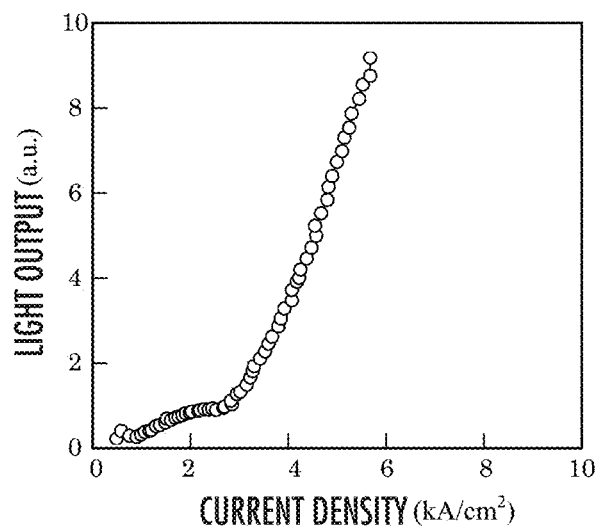
FIG. 19A is a chart showing a relationship between the current density and light output of the PCSEL 30 according to the fourth embodiment.
Figure 19B:
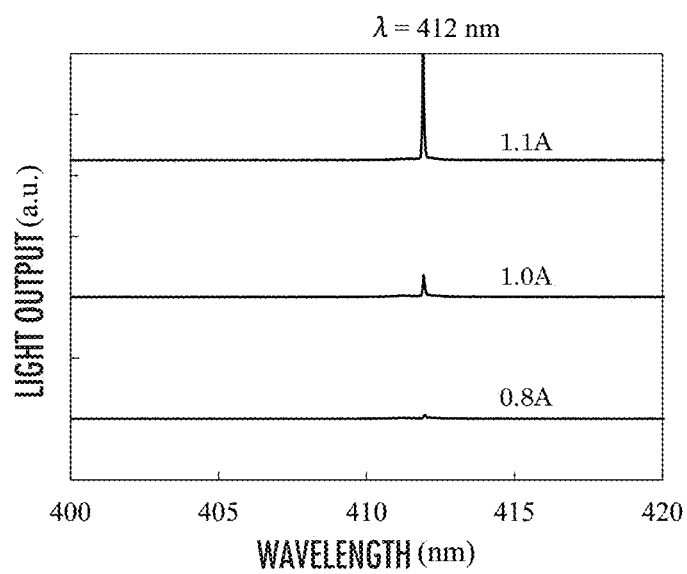
FIG. 19B is a chart showing an oscillation spectrum of the PCSEL 30 according to the fourth embodiment.

FIG. 19A shows a relationship between the current density and the light output (peak value) of the PCSEL 30 (I-L characteristic) according to the present embodiment. FIG. 19B shows an oscillation spectrum.

The PCSEL 30 was observed to produce highly unimodal laser oscillation at a threshold current density $J_{th}$=2.5 kA/cm² (current I=1.0 A) by pulsed current driving with a pulse width of 100 ns and a pulse period of 1 kHz. The oscillation wavelength λ was 412 nm, the same as the design value.

This threshold current density $J_{th}$ is greatly reduced compared to the threshold current density of 67 kA/cm² according to Non-Patent Literature 1. In other words, improvements to the quality and crystallinity of the active layer were confirmed to contribute highly in addition to a large reduction in the light scattering loss ($\alpha_{scat}$) due to nonuniform air hole sizes of the photonic crystal layer 14P (4) In Composition of Second Embedding Layer 25

Figure 21A:
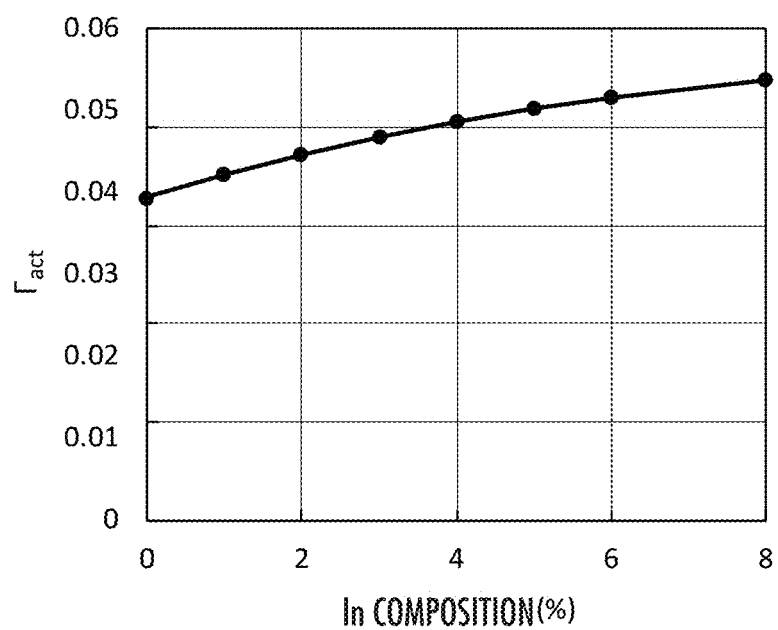
FIG. 21A is a chart showing an optical confinement factor Γact of the active layer with respect to the In composition.
Figure 21B:
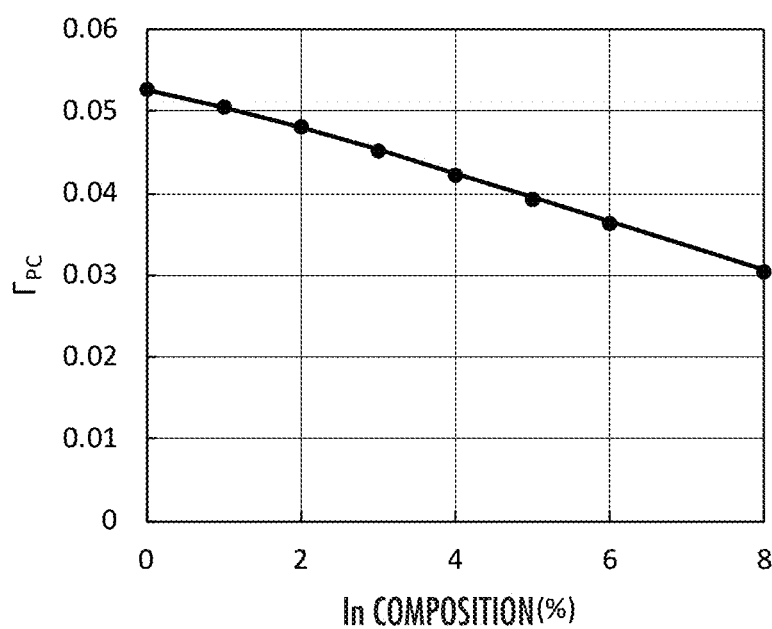
FIG. 21B is a chart showing an optical confinement factor Γpc of the photonic crystal layer with respect to the In composition.
Figure 22:
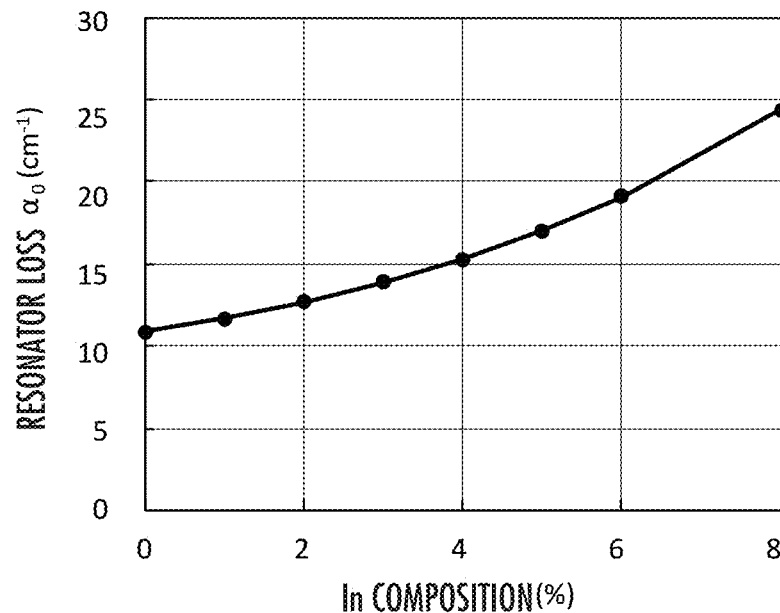
FIG. 22 is a chart showing a resonator loss α0 with respect to the In composition.
Figure 23:
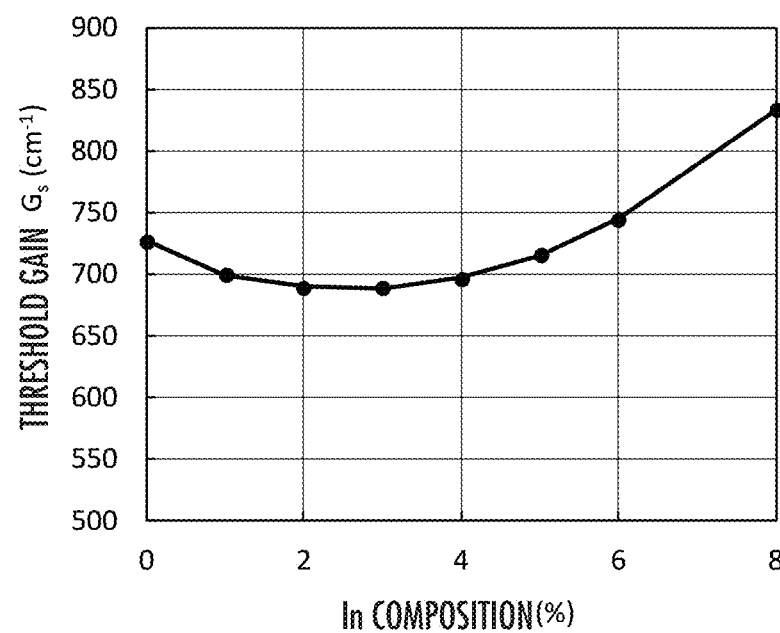
FIG. 23 is a chart showing the dependence of a threshold gain Gs on the In composition of an InGaN layer.

FIGS. 20A and 20B show the one-dimensional optical coupling coefficient K1D and the two-dimensional optical coupling coefficient $\kappa_{2D}$ with respect to the In composition, respectively. The one-dimensional optical coupling coefficient K1D is the coupling coefficient of light diffracted in ±180° directions. The two-dimensional light coupling efficient $\kappa_{2D}$ is the coupling coefficient of light diffracted in ±90° directions. FIGS. 21A and 21B show the optical confinement factor Γact of the active layer and the optical confinement factor Γpc of the photonic crystal layer with respect to the In composition, respectively. FIG. 22 shows the resonator loss α0 with respect to the In composition. In these charts, the values were calculated with the In composition of the active layer as 8% and the thickness of the InGaN layer, or the second embedding layer 25, as 50 nm. FIG. 23 shows the dependence of the threshold gain Gs on the In composition of the InGaN layer. The values were calculated with the internal loss αi as 13 cm⁻¹.

Since the addition of In enhances the surface migration, the higher the better the In composition during planarization can be said to be. However, as the In composition of the second embedding layer 25 increases, the optical coupling coefficients K1D and $\kappa_{2D}$ decrease as shown in FIGS. 20A and 20B and the resonance effect weakens. The reason is that, as shown in FIGS. 21A and 21B, the provision of the second embedding layer 25 increases the presence of the propagating light in the active layer and decreases the ratio of the light present in the photonic crystal layer.

As a result, as shown in FIG. 22, the resonator loss increases with the increasing In composition. For laser oscillation, the foregoing gain condition (Eq. 1) needs to be satisfied, i.e., the gain needs to exceed the total loss. In the present embodiment, the internal loss is approximately 13 cm⁻¹. The threshold gain Gs estimated on the basis of the internal loss thus changes as shown in FIG. 23 with respect to the In composition of the second embedding layer 25.

As shown in FIG. 23, if the In composition of the second embedding layer 25 reaches or exceeds 5%, the threshold gain Gs undesirably becomes higher than that without the second embedding layer 25. The In composition of the second embedding layer 25 is thus preferably less than or equal to 5% (⅝ the In composition of the active layer).

Referring to FIG. 23, the threshold gain Gs is lower when the In composition of the second embedding layer 25 is 1% to 4% than without the second embedding layer 25. The In composition of the second embedding layer 25 is thus more preferably 1% to 4%.

The second embedding layer 25 may include a plurality of layers instead of a single layer. Alternatively, the second embedding layer 25 may have a superlattice structure of GaN and InGaN, for example. In such a case, the second embedding layer 25 preferably has an average In composition of less than or equal to 5% (⅝ the In composition of the active layer) as described above, and more preferably 1% to 4%.

3. Reduction of Threshold Current Density by Second Embedding Layer 25

Referring to FIG. 23, it can be seen that the provision of the second embedding layer 25 reduces the threshold gain Gs. In the present embodiment, the In composition of the second embedding layer 25 is 2% and the threshold gain Gs is 690 cm⁻¹. This value is lower than 728 cm⁻¹ of the PCSEL 10 (FIG. 1A) including no second embedding layer 25 according to the foregoing third embodiment. However, the change in the oscillation threshold current density estimated from the foregoing value is only as much as the oscillation threshold current density decreases to approximately 95% that of the PCSEL 10. That is, the reduction in the threshold current density from 5.5 kA/cm² of the PCSEL 10 to 2.5 kA/cm² of the present embodiment is not ascribable to the reduction in the threshold gain Gs but can be said to result from the effect of embedding the foregoing shallow pits PT with the addition of In.

The embodiments of the present invention have been described above in detail. However, the foregoing embodiments can be implemented in various combinations. For example, the foregoing fourth embodiment has dealt with the case where both the selective etching step (S3c) and the crystal growth (S3d: embedding layer (first embedding layer) formation step) by mass transport at low temperature (900° C.) and the supply of the material gas are performed. However, either one of the steps may be performed alone. Similarly, in manufacturing the PCSELs 10 and 30, the manufacturing steps of the first to third embodiments can be performed in combination as appropriate.

According to the foregoing embodiments, variations in the size and shape of the air holes included in the photonic crystal layer can be suppressed. A photonic-crystal laser (PCSEL) device that can oscillate at a low threshold current density and a manufacturing method thereof can thus be provided.

In addition, a photonic-crystal surface-emitting laser in which an active layer grown on a photonic crystal layer has high quality and crystallinity and that can oscillate at an extremely low threshold current density and a manufacturing method thereof can be provided.

As has been described in detail above, a photonic-crystal surface-emitting laser including a photonic crystal having extremely highly uniform air hole sizes and a manufacturing method thereof are provided.

Moreover, a photonic-crystal surface-emitting laser where variations in the size and shape of air holes included in a photonic crystal layer can be suppressed and controlled and that can oscillate at a low threshold current density and a manufacturing method thereof can be provided.

Furthermore, a high performance photonic-crystal surface-emitting laser in which an active layer grown on a photonic crystal layer has high quality and crystallinity and that can oscillate at a low threshold current density and a manufacturing method thereof can be provided.

REFERENCE SIGNS LIST 10, 30, 40: PCSEL device
11: semiconductor structure layer
12: substrate
13: first cladding layer
14: first guide layer
14A: lower guide layer
14P: photonic crystal layer (PC layer)
14B: first embedding layer
15: active layer 16: second guide layer
17: electron blocking layer
18: second cladding layer
19: contact layer
20A: first electrode
20B: second electrode
20L: light-emitting area
25: second embedding layer

What is claimed is:

1. A manufacturing method for manufacturing a surface-emitting laser device made of a GaN-based semiconductor by an MOVPE method, the manufacturing method comprising steps of:
   (a) growing a first cladding layer of a first conductive type on a substrate, with a {0001} plane as a growth plane;
   (b) growing a guide layer on the first cladding layer;
   (c) forming holes in a surface of the guide layer by etching, the holes being two-dimensionally periodically arranged within a plane parallel to the guide layer;
   (d) etching the guide layer by using an etchant having selectivity to a {10-10} plane of the guide layer;
   (e) supplying a gas containing a nitrogen source to cause mass transport without supplying a group-III material gas, and then supplying the group-III material gas for growth, whereby a first embedding layer closing openings of the holes is formed to form a photonic crystal layer; and
   (f) growing an active layer and a second cladding layer of a second conductive type in this order on the first embedding layer, the second conductive type being opposite to the first conductive type, wherein
   in the steps (e) and (f), air holes formed in the photonic crystal layer have a hexagonal column shape surrounded by the {10-10} planes, and the air holes have a diameter distribution including a single unimodal distribution with a standard deviation ($\alpha$) of 1 nm or less, and a proportion of air holes belonging to the unimodal distribution to all the air holes is 95% or higher.

2. The manufacturing method according to claim 1, wherein the etchant having the selectivity in the step (d) is any one of an organic base including any one of TMAH (tetramethylammonium hydroxide), TEAH (tetraethylammonium hydroxide), and EDTA (ethylenediaminetetraacetic acid), and an alkali metal hydroxide including any one of KOH, LiOH, and NaOH.

3. The manufacturing method according to claim 1, wherein:
   the holes have a cylindrical shape; and
   the step (d) includes performing the etching so that the holes have a hexagonal column shape surrounded by {10-10} planes, and a diameter distribution of the holes after the etching has a single unimodal distribution with a standard deviation ($\alpha$) of 1 nm or less.

4. The manufacturing method according to claim 1, wherein the step (e) includes increasing a temperature of the substrate to a growth temperature within a temperature range of 850° C. to 950° C. to cause the mass transport without supplying the group-III material gas to form necks on the openings of the holes, and after the growth temperature is reached, supplying the group-III material gas for crystal growth, whereby the openings of the holes are closed to form the first embedding layer.

5. The manufacturing method according to claim 1, wherein:
   the guide layer is a GaN layer; and
   the step (e) includes forming a second embedding layer containing In in its composition after the first embedding layer closing the openings is formed.

6. The manufacturing method according to claim 5, wherein the second embedding layer is an InGaN layer, and has an In composition within a range of 1% to 4%.

7. The manufacturing method according to claim 5, wherein the second embedding layer is any of a multilayer structure including a plurality of layers including an InGaN layer and a GaN layer and a superlattice structure made of GaN and InGaN, and has an average In composition within a range of 1% to 4%.

* * * * *